US012601774B2

(12) United States Patent
Valle et al.

(10) Patent No.: US 12,601,774 B2
(45) Date of Patent: Apr. 14, 2026

(54) LOW NOISE READOUT INTERFACE FOR CAPACITIVE SENSORS WITH NEGATIVE CAPACITANCE

(71) Applicant: INVENSENSE, INC., San Jose, CA (US)

(72) Inventors: Stefano Valle, Milan (IT); Tomasz E. Hanzlik, Szczecin (PL)

(73) Assignee: INVENSENSE, INC., San Jose, CA (US)

( * ) Notice: Subject to any disclaimer, the term of this patent is extended or adjusted under 35 U.S.C. 154(b) by 328 days.

(21) Appl. No.: 18/331,323

(22) Filed: Jun. 8, 2023

(65) Prior Publication Data

US 2023/0408564 A1     Dec. 21, 2023

Related U.S. Application Data

(60) Provisional application No. 63/350,084, filed on Jun. 8, 2022.

(51) Int. Cl.
*G01R 27/26* (2006.01)
*H04R 3/00* (2006.01)
*H04R 19/04* (2006.01)

(52) U.S. Cl.
CPC ........... *G01R 27/2605* (2013.01); *H04R 3/00* (2013.01); *H04R 19/04* (2013.01); *H04R 2201/003* (2013.01); *H04R 2410/03* (2013.01)

(58) Field of Classification Search
CPC ............... G01R 27/2605; H04R 19/04; H04R 2201/003; H04R 2410/03; H04R 3/00; H03F 2203/45546; H03F 1/223; H03F 1/26; H03F 1/3264; H03F 3/183; H03F 3/45475; H03G 3/3005
USPC .......................................................... 324/658
See application file for complete search history.

(56) References Cited

U.S. PATENT DOCUMENTS

| | | | | |
|---|---|---|---|---|
| 2008/0180165 A1* | 7/2008 | Mijuskovic | .............. | G01D 5/24 |
| | | | | 327/551 |
| 2009/0243720 A1* | 10/2009 | Golden | ................ | H03H 11/481 |
| | | | | 330/149 |
| 2015/0311870 A1* | 10/2015 | Kropfitsch | .............. | H03F 1/086 |
| | | | | 330/296 |
| 2019/0207564 A1* | 7/2019 | Xavier | .................. | H03F 1/0205 |
| 2019/0363679 A1* | 11/2019 | Xavier | ................ | H03F 3/45192 |
| 2021/0294454 A1* | 9/2021 | Liu | ........................ | G06F 3/0418 |

* cited by examiner

*Primary Examiner* — Raul J Rios Russo
(74) *Attorney, Agent, or Firm* — Amin, Turocy & Watson, LLP

(57) ABSTRACT

Disclosed embodiments provide a self-contained topology that enables a significant noise reduction of capacitive sensor readout interfaces. For example, various embodiments can provide low noise capacitive sensor readout interfaces or analog front ends having a main buffer amplifier in a bootstrap configuration, wherein a bootstrap loop configuration comprises a negative capacitance coupled to an input of the main buffer amplifier with a negative impedance converter.

20 Claims, 17 Drawing Sheets

$$STF = \frac{V_o}{V_s} = \frac{C_s}{C_s + C_{pp}}$$

$$NTF = \frac{V_o}{v_n} = \frac{C_s + C_{pp} + C_l}{C_s + C_{pp}}$$

$$SNR = \frac{C_s^2}{(C_s + C_{pp} + C_l)^2} \frac{V_s^2}{V_n^2}$$

$$STF = \frac{V_0}{V_s} = \frac{C_s}{C_s + C_{pp}}$$

$$NTF1 = \frac{V_0}{V_n} = \frac{C_s + C_{pp} + C_l + C_n}{C_s + C_{pp}}$$

$$NTF2 = \frac{V_0}{V_{nn}} = \frac{C_n}{C_s + C_{pp}}$$

$$v_{nn}^2 = k \cdot v_n^2$$

502

504

$$NOISEPSD = v_n^2 \left[ \frac{\left( C_s + C_{pp} + C_l + C_n \right)^2 + k C_n^2}{\left( C_s + C_{pp} \right)^2} \right]$$

210

$C_n$ *can be optimized to minimize noise contribution*

$$C_n = -\frac{C_s + C_{pp} + C_l}{1 + k} \qquad NOISEPSD = \left( \frac{C_s + C_{pp} + C_l}{C_s + C_{pp}} \right)^2 \frac{k}{1+k} v_n^2$$

506

$$SNR = \frac{C_s^2}{\left( C_s + C_{pp} + C_l \right)^2} \frac{k+1}{k} \frac{V_s^2}{V_n^2}$$

$$STF = \frac{V_0}{V_s} = \frac{C_s}{C_s + C_{pp} + C_n}$$

$$NTF1 = \frac{V_0}{V_n} = \frac{C_s + C_{pp} + C_t + C_n}{C_s + C_{pp} + C_n}$$

$$NTF2 = \frac{V_0}{V_{nn}} = \frac{C_n}{C_s + C_{pp} + C_n}$$

1300

1302

$$v_{nn}^2 = k \cdot v_n^2$$

1304

$$NOISEPSD = v_n^2 \frac{(C_s + C_{pp} + C_i + C_n)^2 + kC_n^2}{(C_s + C_{pp} + C_n)^2}$$

210

$C_n$ can be optimized to minimize noise contribution $$C_n = -\frac{C_s + C_{pp} + C_i}{1 + k}$$

1306

$$SNR = \frac{C_s^2}{(C_s + C_{pp} + C_i)^2} \frac{(1+k)^2}{1+k^2} \frac{v_s^2}{v_n^2}$$

$$C_3 = \frac{C_s + C_{pp} + C_t}{\frac{C_3}{C_2}\left(1 + k\left(1 + \frac{C_2}{C_1}\right)\right)}$$

$$STF\_V_{oa} = \frac{C_s}{C_s + C_{pp} - C_3 \frac{C_1}{C_2}}\left(1 + \frac{C_2}{C_1}\right)$$

$$STF = \frac{C_s}{C_s + C_{pp} - C_3 \frac{C_1}{C_2}}$$

$$NOISE = \frac{\frac{C_s + C_{pp} + C_t - C_3 \frac{C_1}{C_2}}{C_s + C_{pp} - C_3 \frac{C_1}{C_2}} v_n + \frac{\frac{C_3}{C_2} \frac{C_1}{C_2}}{C_s + C_{pp} - C_3 \frac{C_1}{C_2}} v_{noa} \left(1 + \frac{C_2}{C_1}\right)}{}$$

| c1 | c2 | c3 | SNR Gain dB | Sens. Gain (dB) |
|---|---|---|---|---|
| 0.10 | 0.50 | 0.4730 | 0.12 | 0.34 |
| 1.25 | 0.50 | 0.4730 | 1.79 | 5.56 |
| 2.00 | 0.50 | 0.4730 | 1.75 | 12.28 |

APPLY A NEGATIVE CAPACITANCE AT AN INPUT OF A MAIN BUFFER AMPLIFIER IN A SOURCE FOLLOWER SENSOR READOUT INTERFACE ASSOCIATED WITH A CAPACITIVE SENSOR, WHEREIN THE MAIN BUFFER AMPLIFIER IS CONFIGURED IN A BOOTSTRAP CONFIGURATION AT AN OUTPUT OF THE CAPACITIVE SENSOR     1702

REDUCE SOURCE FOLLOWER SENSOR READOUT INTERFACE NOISE VIA A BOOTSTRAP LOOP OF THE BOOTSTRAP CONFIGURATION, WHEREIN THE BOOTSTRAP LOOP COUPLED TO THE NEGATIVE CAPACITANCE IS CONFIGURED TO REDUCE NOISE ASSOCIATED WITH THE SOURCE FOLLOWER SENSOR READOUT INTERFACE AND THAT IS ATTRIBUTABLE TO THE MAIN BUFFER AMPLIFIER     1704

FIG. 17

LOW NOISE READOUT INTERFACE FOR CAPACITIVE SENSORS WITH NEGATIVE CAPACITANCE

PRIORITY CLAIM

This patent application is a Non-Provisional application that claims priority to U.S. Provisional Patent Application Ser. No. 63/350,084, filed Jun. 8, 2022, entitled "LOW NOISE READOUT INTERFACE FOR CAPACITIVE SENSORS WITH NEGATIVE CAPACITANCE," the entirety of which is incorporated by reference herein.

TECHNICAL FIELD

The subject disclosure relates to capacitive sensors and, more specifically, to low noise readout interfaces with negative capacitance for capacitive sensors.

BACKGROUND

Capacitive sensor readout interfaces are often limited by the noise performance of the analog front end (AFE) or sensor readout interface. For example, microphone readout interfaces can be limited by AFE noise performance of the analog front end. Capacitive sensors typically provide very small signals. As a result, conventional readout interfaces have been developed that account for such problems associated with capacitive sensors. Thus, it can be understood that noise of the AFE or readout interface should be very low to account for the associated small sensor signals.

In addition, capacitive sensors can suffer from parasitic capacitances, which can be mitigated by adopting conventional bootstrap techniques. With conventional bootstrap techniques, signal-to-noise ratio (SNR) can be improved by reducing the attenuation of the signal. However, added noise of the buffer amplifier in the AFE or sensor readout interface can result in further SNR deterioration.

It is thus desired to provide low noise capacitive sensor readout interfaces or AFE that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, various embodiments as described herein can provide low noise capacitive sensor readout interfaces or AFE employing a negative impedance converter (NIC) topology referred to herein as a negative capacitance converter NCC. In various non-limiting embodiments, the described low noise capacitive sensor readout interfaces or AFE enables reduction or cancellation of AFE, but with the addition of noise associated with the NIC topology. Accordingly, described embodiments can provide low noise capacitive sensor readout interfaces or AFE with same or improved SNR compared to convention implementations of similar conventional capacitive sensor readout interfaces or AFE when the negative capacitance of the NCC is properly optimized.

In a non-limiting aspect, various embodiments can provide low noise capacitive sensor readout interfaces or AFE having a main buffer amplifier in a bootstrap configuration, wherein a bootstrap loop configuration comprises a negative capacitance coupled to an input of the main buffer amplifier with a negative impedance converter NIC. As used herein, the terms NCC or NIC are used interchangeably, depending on context, where the impedance in a NIC is determined primarily based on capacitances of the NIC. As described herein, various non-limiting embodiments can reduce or cancel the noise attributable to the main buffer amplifier in the low noise capacitive sensor readout interfaces or AFE. In a further non-limiting aspect, by balancing noise introduced by the NIC with the noise associated with the main buffer amplifier capacitive sensor readout interfaces or AFE a SNR advantage can be obtained.

In still other non-limiting aspects, a gain in the signal transfer function of the low noise capacitive sensor readout interfaces or AFE can be obtained, whereas an automatic gain control (AGC) for the low noise capacitive sensor readout interfaces or AFE provided, as further described herein. According to further aspects, while various embodiments are described herein regarding exemplary microelectromechanical systems (MEMS) acoustic or microphone sensors for the purpose of illustration and not limitation, it can be understood that the described embodiments can be employed with any of a number of other capacitive sensors for which low noise capacitive sensor readout interfaces or AFE are desired.

In a non-limiting example, a source follower sensor readout interface is provided comprising a main buffer amplifier, wherein the main buffer amplifier is configured in a bootstrap configuration at an output of a capacitive sensor. In addition, a bootstrap loop of the bootstrap configuration can comprise a negative capacitance coupled to an input of the main buffer amplifier, wherein the bootstrap configuration comprising a negative capacitance at the input of the main buffer amplifier is configured to reduce noise associated with the source follower sensor readout interface and that is attributable to the main buffer amplifier.

In a further non-limiting aspect, exemplary methods associated with low noise capacitive sensor readout interfaces or analog front ends are described.

These and other embodiments are described in more detail below.

BRIEF DESCRIPTION OF THE DRAWINGS

Various non-limiting embodiments are further described with reference to the accompanying drawings, in which:

FIG. 17 depicts an exemplary flowchart of non-limiting methods associated with a various non-limiting embodiments of the subject disclosure.

DETAILED DESCRIPTION

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

According to various described embodiments, the subject disclosure provides low noise capacitive sensor readout interfaces or AFE. As described above, capacitive sensor readout interfaces are often limited by the noise performance of the AFE or sensor readout interface. Thus, described embodiments can provide low noise capacitive sensor readout interfaces or AFE having a main buffer amplifier in a bootstrap configuration, wherein a bootstrap loop configuration comprises a negative capacitance coupled to an input of the main buffer amplifier with a negative impedance converter NIC or NCC. As described herein, various non-limiting embodiments can reduce or cancel the noise attributable to the main buffer amplifier in the low noise capacitive sensor readout interfaces or AFE. In a further non-limiting aspect, by balancing noise introduced by the NIC with the noise associated with the main buffer amplifier capacitive sensor readout interfaces or AFE a SNR advantage can be obtained. By employing a NIC or NCC to obtain a negative capacitance in a bootstrap configuration of a capacitive sensor readout interface or analog front end, such negative capacitance, when properly optimized, can facilitate the reduction and/or cancellation of the main buffer noise when combined with bootstrap configuration. As a result, the various described embodiments can provide a self-contained topology that enables a significant noise reduction of the exemplary capacitive sensor readout interfaces. For instance, if a noise less NIC or NCC could be obtained (ideal case) a complete cancellation of the buffer noise could be achieved. However, in practice, a balance of noise contributions can be the target of optimization of the various low noise capacitive sensor readout interfaces described herein.

Figure 1:
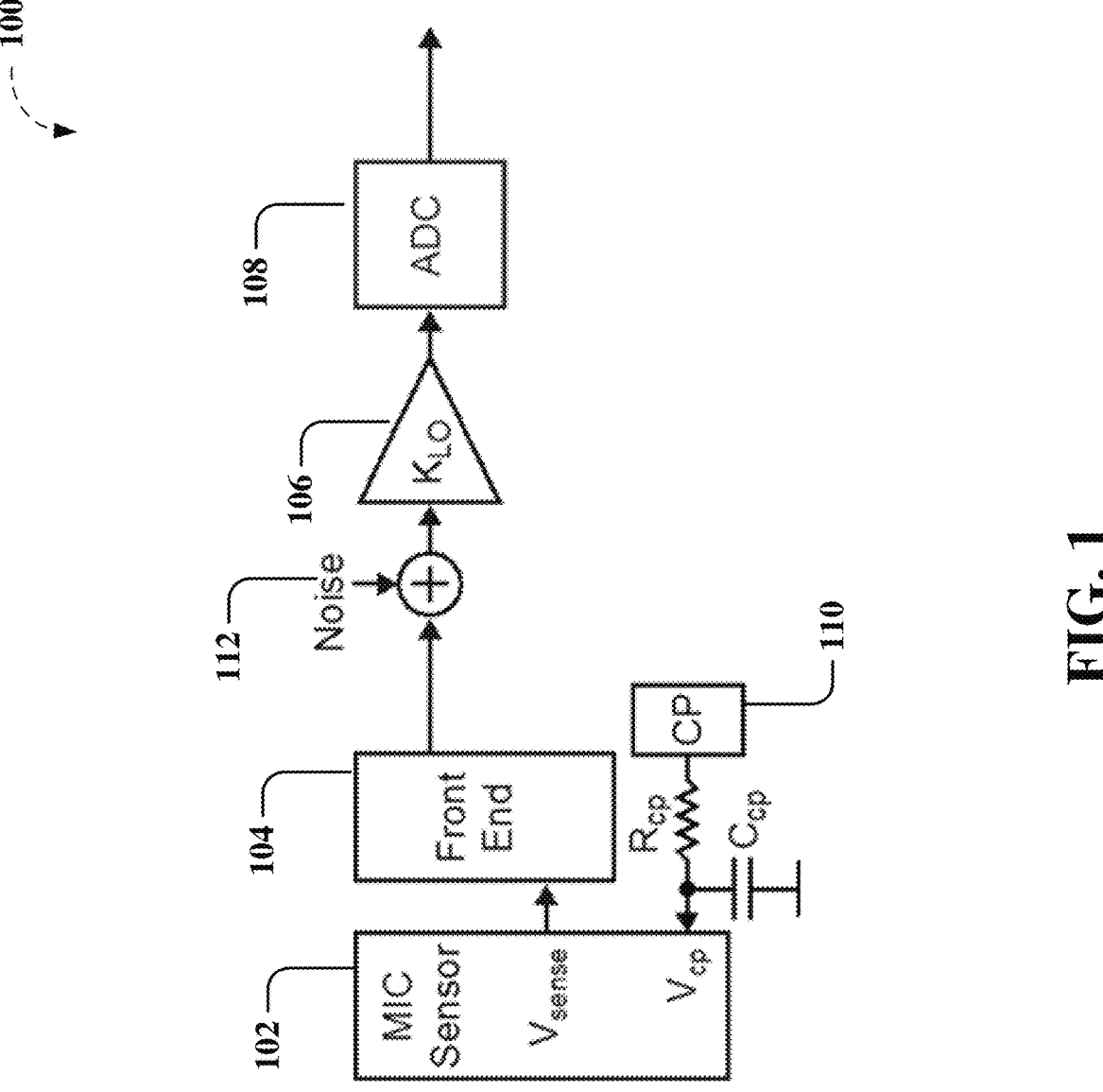
FIG. 1 depicts a functional block diagram of an exemplary operating environment suitable for incorporation of various non-limiting aspects of the subject disclosure.

FIG. 1 depicts a functional block diagram of an exemplary operating environment 100 suitable for incorporation of various non-limiting aspects of the subject disclosure. As a non-limiting example, an exemplary operating environment 100 can comprise one or more capacitive sensors depicted in FIG. 1 as an exemplary microelectromechanical systems (MEMS) acoustic or microphone sensors 102 (e.g., one or more of MEMS acoustic or microphone sensor, etc.). In various embodiments, exemplary systems are depicted as comprising one MEMS acoustic or microphone sensor 102, whereas other exemplary systems can be described as comprising one or more capacitive sensors 102. It can be appreciated that the various MEMS acoustic or microphone sensors 102 need not be identical in design, fabrication, characteristic, and/or placement, etc., and according to a non-limiting aspect, the one or more exemplary MEMS acoustic or microphone sensors 102 vary in one or more of the forgoing aspects. In a non-limiting aspect, the one or more of MEMS acoustic or microphone sensors 102 can be configured to receive one or more of the acoustic signal or a variation associated with the acoustic signal (e.g., such as the acoustic signal varied by differences in time, location, acoustic path, etc.) or can be comprised of any number of disparate transducer structures (e.g., numbers and/or configuration of membranes, etc.), and can comprise any of a number of front end circuit designs (e.g., supplying variable charge pump voltages, etc.), for example, as further described herein.

The one or more MEMS acoustic or microphone sensors 102 can be configured to receive one or more acoustic signals, and can be operatively coupled to one or more components or circuitry 104 (e.g., one or more components or circuitry 104, etc., sometimes referred to, herein, as "front end" or "analog front end") configured to process one or more electrical signals (e.g., one or more electrical signals associated with one or more of MEMS acoustic or microphone sensor, one or more of capacitive sensor, etc.) that vary in accordance with the one or more acoustic signals (or other sensed parameter) to create one or more corresponding processed electrical signal (e.g., at one or more outputs of the one or more components or circuitry 104, etc.).

In a further non-limiting example, an exemplary operating environment 100 can comprise one or more exemplary amplifier or gain stage 106 (e.g., one or more amplifier or gain stage 106, etc.) operatively coupled to the one or more output associated with the one or more components or circuitry 104 (e.g., one or more of components or circuitry 104, etc.). In a non-limiting aspect, the one or more amplifier or gain stage 106 can be configured to receive the one or more corresponding processed electrical signals and/or apply one or more scaling factors (e.g., one or more analog scaling factors) to the one or more corresponding processed electrical signals via an automatic gain control (AGC) component (not shown), for example, as further described herein, regarding FIGS. 2-16. As, further described herein, whereas a conventional AGC component typically acts to determine gain of the one or more amplifier or gain stage 106, as used herein, an AGC component is described as facilitating adjustment of one or more of a signal gain or signal attenuation of particular sensor readout interfaces for the output signal, e.g., at the output of the one or more components or circuitry 104 (e.g., one or more components or circuitry 104, etc., sometimes referred to, herein, as "front end" or "analog front end").

In addition, exemplary operating environment 100 can further comprise one or more exemplary ADCs 108 operatively coupled to one or more outputs associated with the one or more amplifier or gain stage 106, as further described herein, regarding FIGS. 2-16. In another non-limiting aspect, the one or more exemplary ADCs 108 can be configured to provide one or more digital audio signals having different digital scaling factors associated with the one or more acoustic signals (e.g., at outputs associated with the one or more ADCs 108, etc.). In a further non-limiting aspect, the one or more components or circuitry 104 can comprise or be associated with one or more adjustable direct current (DC) bias voltage circuit operatively coupled to the one or more of MEMS acoustic or microphone sensors 102 and can be configured to adjust one or more DC bias voltage provided to the one or more of MEMS acoustic or microphone sensors 102, respectively, e.g., via one or more charge pump 110.

As depicted in FIG. 1, a typical block diagram may consider all of the noise associated with the lump all of the noise in the system prior to the one or more amplifier or gain stage 106 as one discrete unit, which can be used, for example, in the design of the one or more amplifier or gain stage 106 and/or the one or more ADCs 108. However, because readout interfaces for capacitive sensors, such as microphones or acoustic sensors (which capacitive sensors typically provide very small signals), can be limited by noise performance of the AFE, the individual noise contributions of various components of the capacitive sensor and AFE are considered herein to illustrate how such capacitive sensors can benefit from the provided low noise capacitive sensor readout interfaces or AFE.

Figure 3:
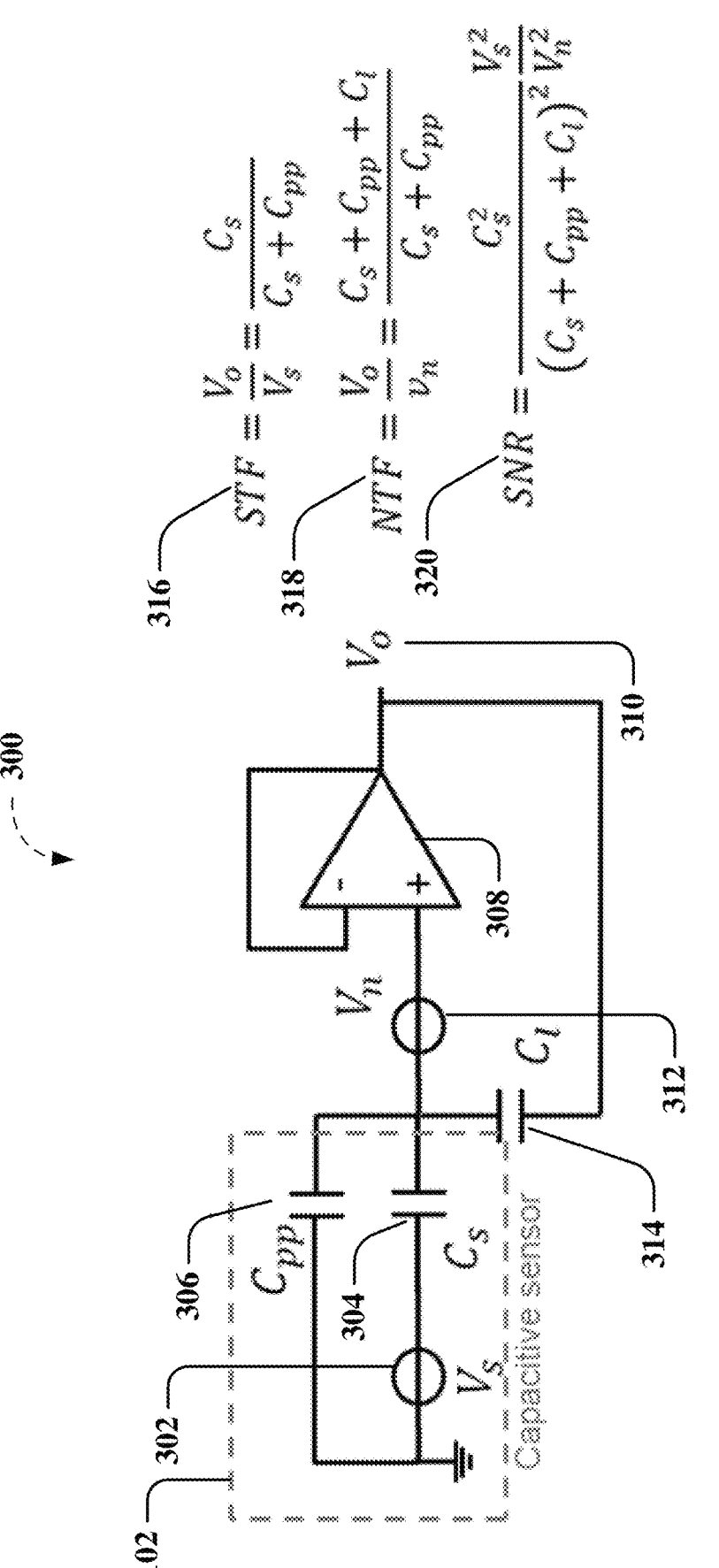
FIG. 3 depicts a non-limiting block diagram of an exemplary operating environment suitable for incorporation of various non-limiting aspects of the subject disclosure.

Thus, an exemplary operating environment can comprise an exemplary MEMS acoustic or microphone sensor 102, which in response to acoustic pressure provides a low level variable capacitance output, $C_s$, as depicted in FIG. 3, which can be provided to the one or more components or circuitry 104 (e.g., one or more components or circuitry 104, etc., sometimes referred to, herein, as "front end" or "analog front end"), AFE or sensor readout interface 104, comprising an exemplary main buffer amplifier, characterized by a noise ($V_n$) associated with the sensor readout interface and that is attributable to the main buffer amplifier, as further described below regarding FIG. 3.

As described, above, by employing a NIC or NCC to obtain a negative capacitance in a bootstrap configuration of a capacitive sensor readout interface or analog front end, such negative capacitance, when properly optimized, can facilitate the reduction and/or cancellation of the main buffer noise when combined with bootstrap configuration.

Figure 2:
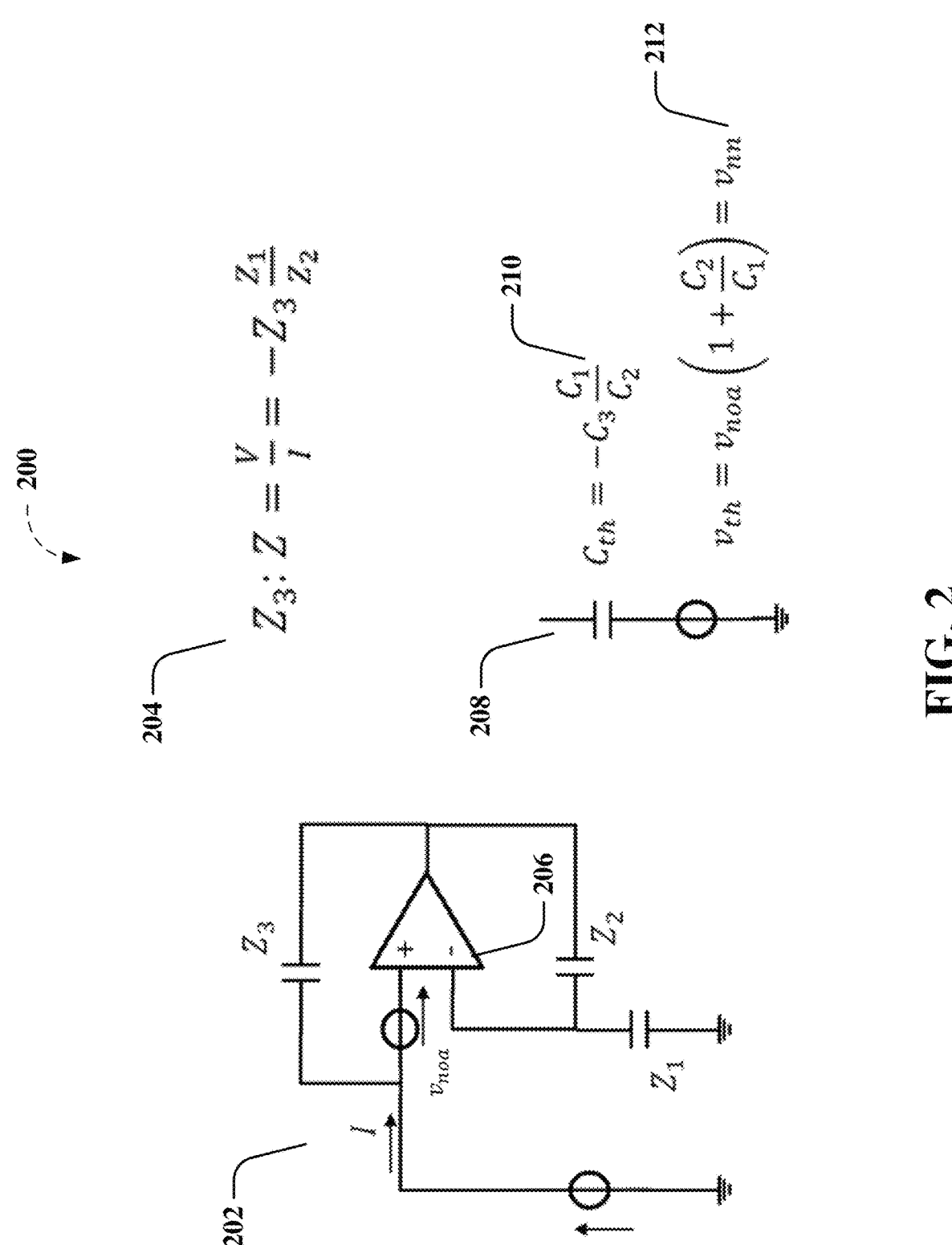
FIG. 2 depicts a non-limiting block diagram of exemplary aspects of a Negative Impedance Converter (NIC), implemented as a Negative Capacitance Converter (NCC), according to various embodiments described herein.

FIG. 2 depicts a non-limiting block diagram 200 of exemplary aspects of a Negative Impedance Converter (NIC) 202, implemented as a Negative Capacitance Converter (NCC), according to various embodiments described herein. For the NIC topology, impedance seen at its node is a scaled negative copy of impedance $Z_3$ as shown in the equation 204. Thus, the negative impedance provided by the NIC depends on the three values of impedance, $Z_1$, $Z_2$, and $Z_3$. According to a non-limiting aspect, in exemplary low noise capacitive sensor readout interfaces or AFE as described herein, all impedances included in exemplary NIC can be implemented with capacitors to limit the noise contribution. To further minimize the noise contribution of the exemplary NICs it is recommended that impedance $Z_2$ is much greater than impedance $Z_1$, and, thus, $C_n$ is much greater than $C_2$, for impedances resulting primarily from capacitance. In further non-limiting aspects, because for real world applications of NICs there is a noise contribution of the op-amp 206 of the NIC topology, various described embodiments can be optimized to minimize noise and/or balance noise considerations with other considerations such as SNR, stability of the output, and so on. Thus, it can be appreciated that the Thevinin equivalent circuit 208 can be represented as a negative equivalent capacitance 210 and a noise generator or noise source 214, which will become part of the noise contribution in various non-limiting embodiments, thereby providing a negative capacitance which can be employed in the various non-limiting embodiments described herein.

FIG. 3 depicts a non-limiting block diagram of an exemplary operating environment 300 suitable for incorporation of various non-limiting aspects of the subject disclosure. For instance, FIG. 3 depicts a source follower readout interface of a capacitive sensor 102 with a bootstrap loop, suitable for incorporation of various aspects of the disclosed subject matter. Exemplary capacitive sensor 102 can be represented as a noise source or noise generator $V_s$ 302 (e.g., as a result acoustic pressure applied to a MEMS microphone diaphragm) and variable capacitance output, $C_s$ 304, along with a parameter that represents all possible parasitic capacitances, $C_{pp}$ 306. The exemplary source follower readout interface of a capacitive sensor 102 comprises a main buffer amplifier 308 in bootstrap loop configuration, which provides an output signal or readout interface signal, $V_o$ 310, which comprises an exemplary AFE or readout interface (e.g., source follower with bootstrap loop) that is used to convert the capacitive sensor 102 noise source or noise generator $V_s$ 302 into output signal or readout interface signal, $V_o$ 310, a useful signal level, with as little added noise as possible. Main buffer amplifier noise, $V_n$ 312, represents the source follower or main buffer amplifier buffer noise as a noise source or noise generator, whereas $C_1$ 314 represents possible capacitances affecting the input of the readout interface and which are bootstrapped via main buffer amplifier 308 in a bootstrap loop configuration. Signal transfer function, STF, represents the conversion of the output signal or readout interface signal $V_o$ 310 based on capacitive sensor 102 noise source or noise generator $V_s$ 302 at the output of the source follower readout interface of capacitive sensor 102, which depends on the ratio of the capacitances as shown in FIG. 3 at 316. Noise transfer function, NTF, represents the translation of the output signal or readout interface signal $V_o$ 310 based on main buffer amplifier noise $V_n$ 312 at the output, which depends on the ratio of the capacitances as shown in FIG. 3 at 318. SNR represents the ratio of the STF to NTF as shown in FIG. 3 at 320.

Figure 4:
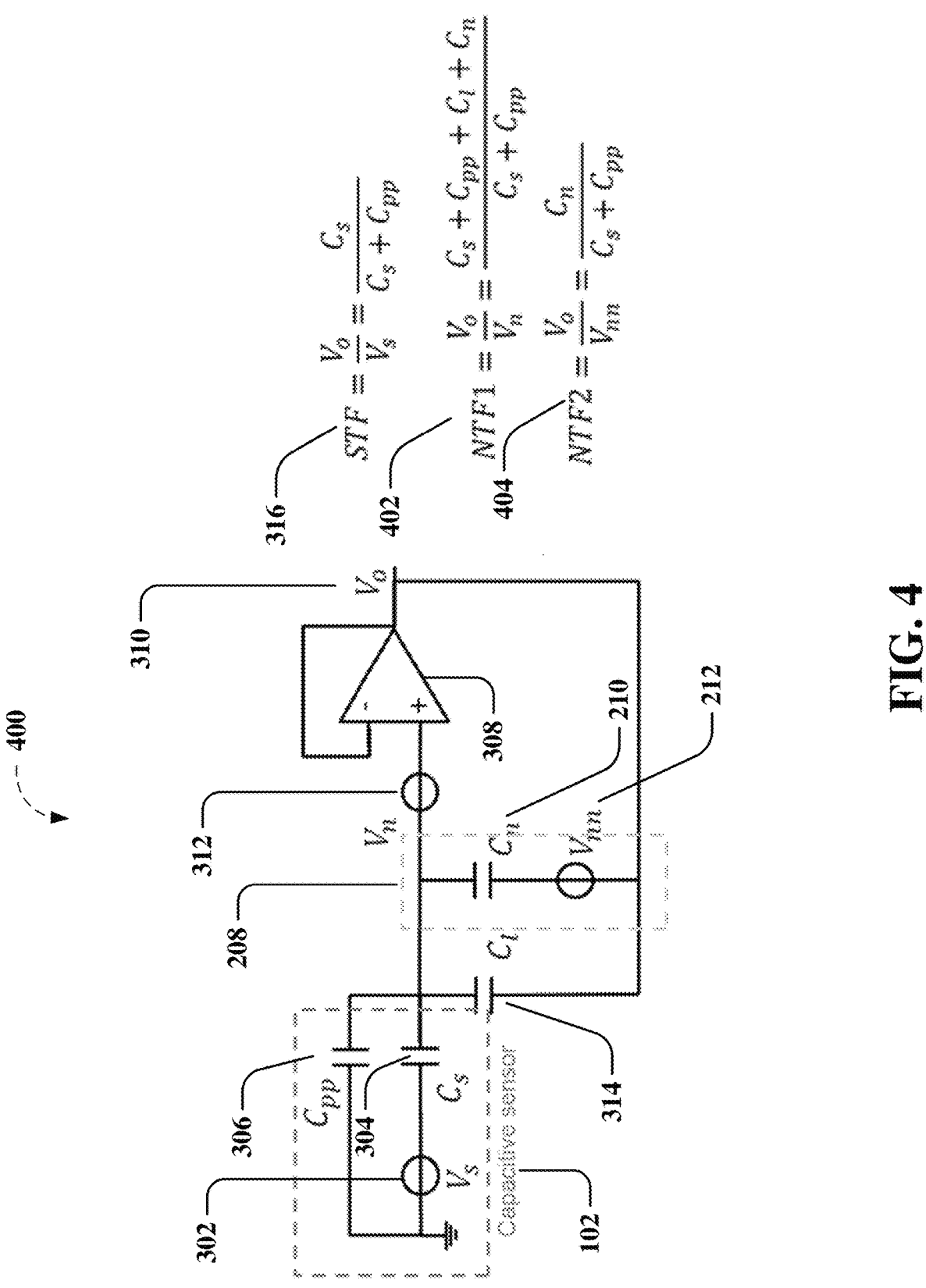
FIG. 4 depicts a non-limiting block diagram of exemplary aspects of a NIC implemented in a bootstrap loop of a readout interface for an exemplary capacitive sensor, according to various embodiments described herein.

FIG. 4 depicts a non-limiting block diagram 400 of exemplary aspects of a NIC 208 implemented in a bootstrap loop of a readout interface for an exemplary capacitive sensor, as described above regarding FIG. 3 according to various embodiments described herein. As described above regarding FIG. 2, the NIC or NCC can be represented as a Thevinin equivalent circuit 208 comprising a negative equivalent capacitance 210 and a noise generator or noise source 214, which, in the exemplary source follower readout interface of capacitive sensor 102 in FIG. 4 is coupled to the input of the main buffer amplifier 308 in the bootstrap loop As in FIG. 3, signal transfer function, STF, represents the conversion of the $V_o$ 310 based on capacitive sensor 102 noise source or noise generator $V_s$ 302 at the output of the source follower readout interface of capacitive sensor 102, which depends on the ratio of the capacitances as shown in FIG. 4 at 316, and for which it is noted that it is the same for the embodiment of FIG. 4 as in FIG. 3. Noise transfer function 1, NTF1, represents the translation of the output signal or readout interface signal $V_o$ 310 based on $V_n$ 312 at the output, which depends on the ratio of the capacitances as shown in FIG. 4 at 402. Noise transfer function 2, NTF2, represents the translation of the $V_o$ 310 based on noise generator or noise source, $V_{nn}$ 214, at the output, which depends on the ratio of the capacitances as shown in FIG. 4 at 404. SNR, which represents the ratio of the STF to NTF is further described below regarding FIG. 5.

From comparison of the source follower readout interface of FIG. 3 with the source follower readout interface of a capacitive sensor with a bootstrap loop incorporating a NIC or NCC 208 into the bootstrap loop of FIG. 4, it can be seen that the same STF is obtained in the exemplary embodiments in FIG. 4 as in FIG. 3, as described. In addition, from the NTF1 402 and NTF2 404 of FIG. 4, it can be seen that, because equivalent capacitance, $C_n$ 210, is negative as shown above regarding FIG. 2, contribution of the main buffer amplifier noise, $V_n$ 312, to the output signal or readout interface signal, $V_o$ 310, can be canceled and/or attenuated by the inserted negative capacitance, $C_n$ 210, at the expense of additional noise generator or noise source, $V_{nn}$ 214, from the NIC or NCC.

Further regarding FIG. 4, it can be understood that negative equivalent capacitance, $C_n$ 210, can be optimized such that the noise contribution of the NIC or NCC, noise generator or noise source, $V_n$ 214, (e.g., NTF2 404) in various embodiments, can be minimized while the contribution of the main buffer amplifier noise, $V_n$ 312, to the output signal or readout interface signal, $V_o$ 310, can be canceled and/or attenuated.

Figure 5:
FIG. 5 demonstrates the signal-to-noise ratio (SNR) performance for the non-limiting block diagram of the NIC implemented in a bootstrap loop of a readout interface for an exemplary capacitive sensor of FIG. 4, according to various embodiments described herein.
Figure 5:
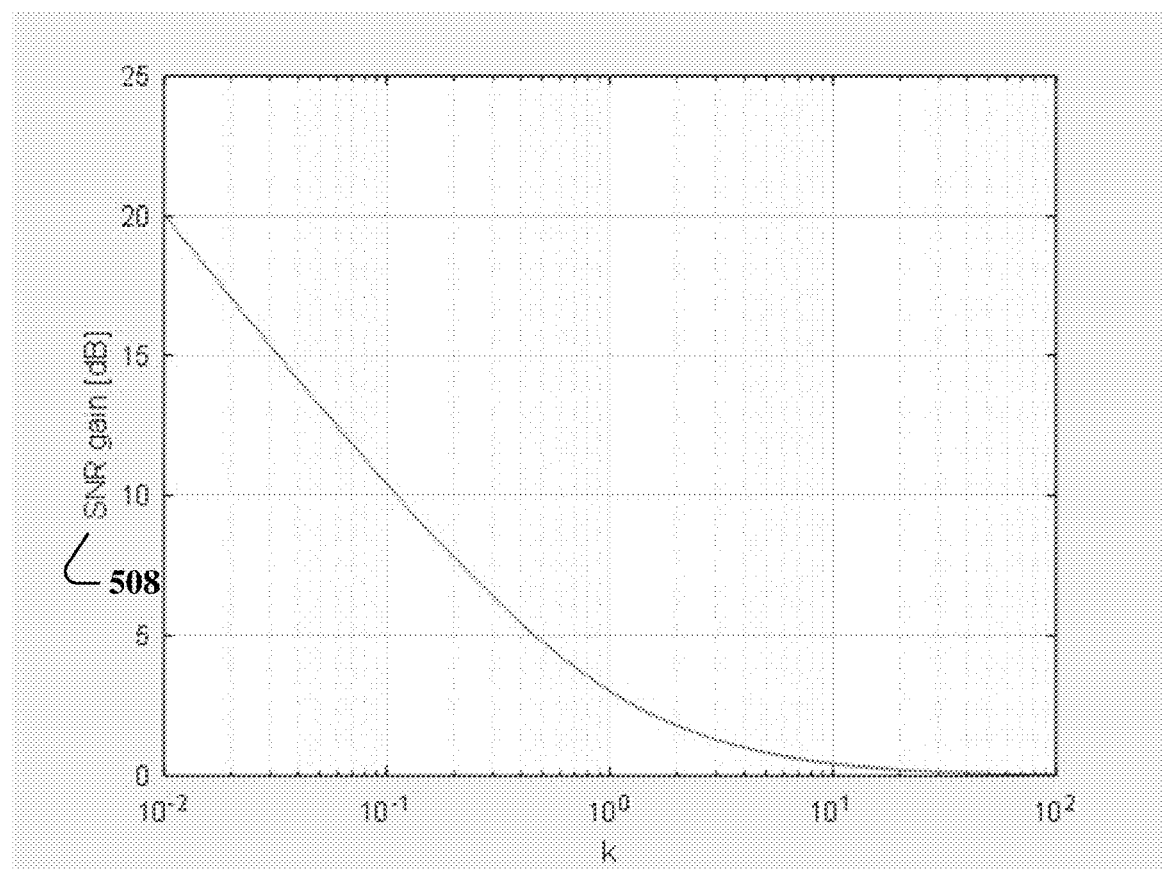

FIG. 5 demonstrates the SNR performance 500 for the non-limiting block diagram 400 of the NIC implemented in a bootstrap loop of a readout interface for an exemplary capacitive sensor 102 of FIG. 4, according to various embodiments described herein. Assuming the square of noise generator or noise source, $V_n$ 214, is as shown in 502, the noise power spectral density (NoisePSD) is given in relationship 504, the minimization of which results in an optimal negative equivalent capacitance, $C_n$ 210. Assuming k is null (ideal case), the negative equivalent capacitance, $C_n$ 210, is the negative of the sum of the variable capacitance output, $C_s$ 304 associated with the capacitive sensor 102, the possible parasitic capacitances, $C_{pp}$ 306, and the $C_n$ 314 (e.g., possible capacitances affecting the input of the readout interface), which results in the numerator of NTF1 402 being zero. In the real case, k is not null and the noise from the source follower readout interface of a capacitive sensor 102 with a bootstrap loop incorporating a NIC or NCC 208 into the bootstrap loop of FIG. 4 is the sum of the two noises, main buffer amplifier noise, $V_n$ 312, and noise contribution of the NIC or NCC 208, noise generator or noise source, $V_{nn}$ 214, which optimizes the SNR 506.

Note further in FIG. 5 from the depiction of the SNR gain 508 (which represents the improvement in SNR from the embodiment of FIG. 4 over that of the embodiment of FIG. 3) that, for any values of noise contribution of the NIC or NCC, noise generator or noise source, $V_{nn}$ 214 (e.g., noise added by NIC or NCC 208 in the bootstrap loop), the SNR 506 is at least not degraded. In a non-limiting aspect, when the added noise, noise generator or noise source, $V_{nn}$ 214, is the same as the noise, main buffer amplifier noise, $V_n$ 312, of the source follower or buffer, e.g., k=1, then SNR 506 can be improved by 3 dB, with respect to the exemplary operating environment of FIG. 3, and even better if the noise generator or noise source, $V_{nn}$ 214, is less than main buffer amplifier noise, $V_n$ 312, or k<1, according to still further non-limiting aspects. In other non-limiting aspects, while the above NIC or NCC topology (e.g., a NIC or NCC coupled to the main buffer amplifier 308 at an input to the main buffer amplifier 104) can be included in an op-amp of an exemplary source follower readout interface of a capacitive sensor 102 as depicted in FIG. 4, the above NIC or NCC topology can also be implemented as a discrete solution to minimize noise of the readout interface of a capacitive sensor 102, when freedom to configure the op-amp is not available.

Figure 6:
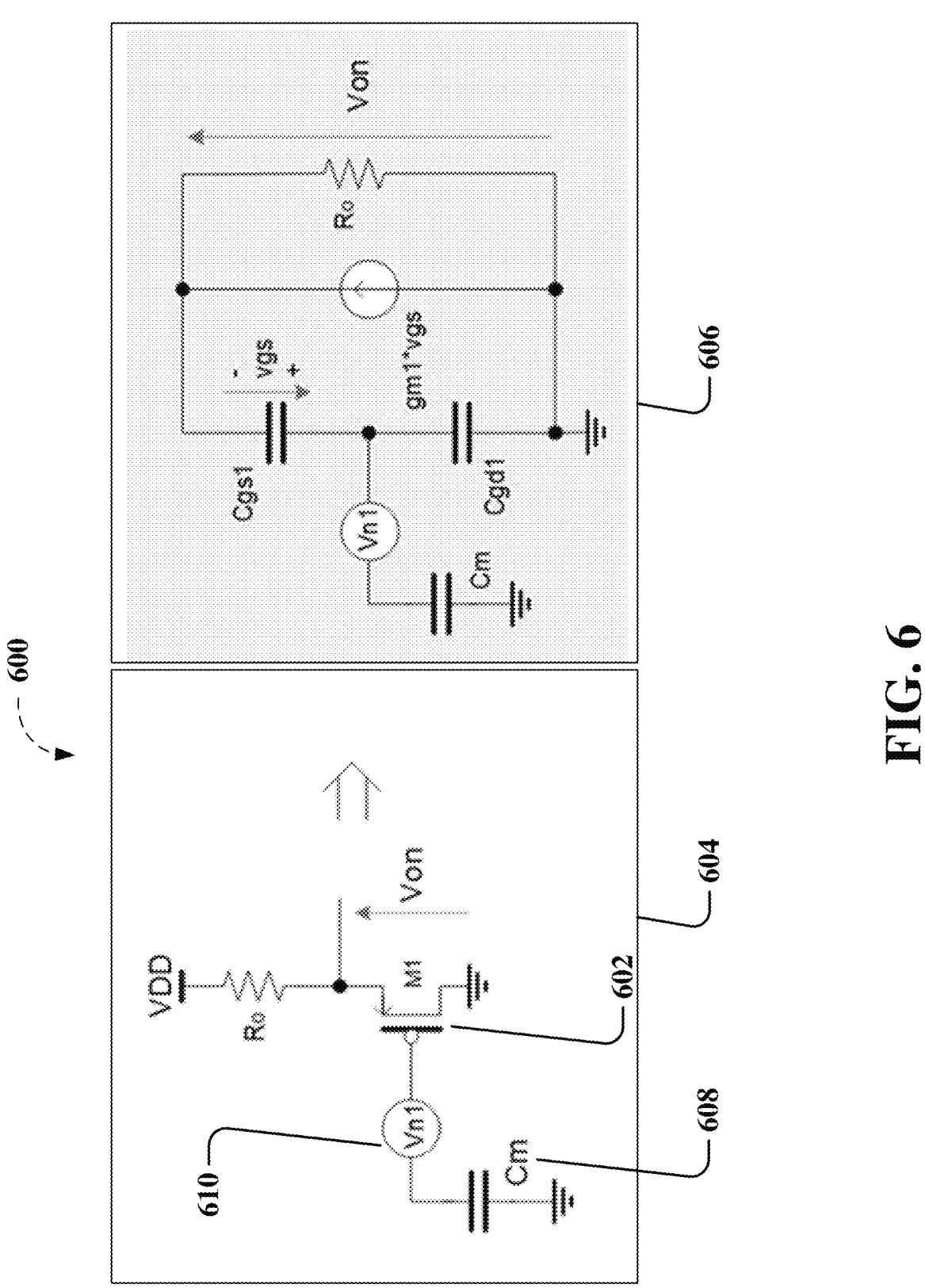
FIG. 6 depicts a functional block diagram of an exemplary operating environment comprising a single transistor source follower readout interface suitable for incorporation of various non-limiting aspects of the subject disclosure.
Figure 7:
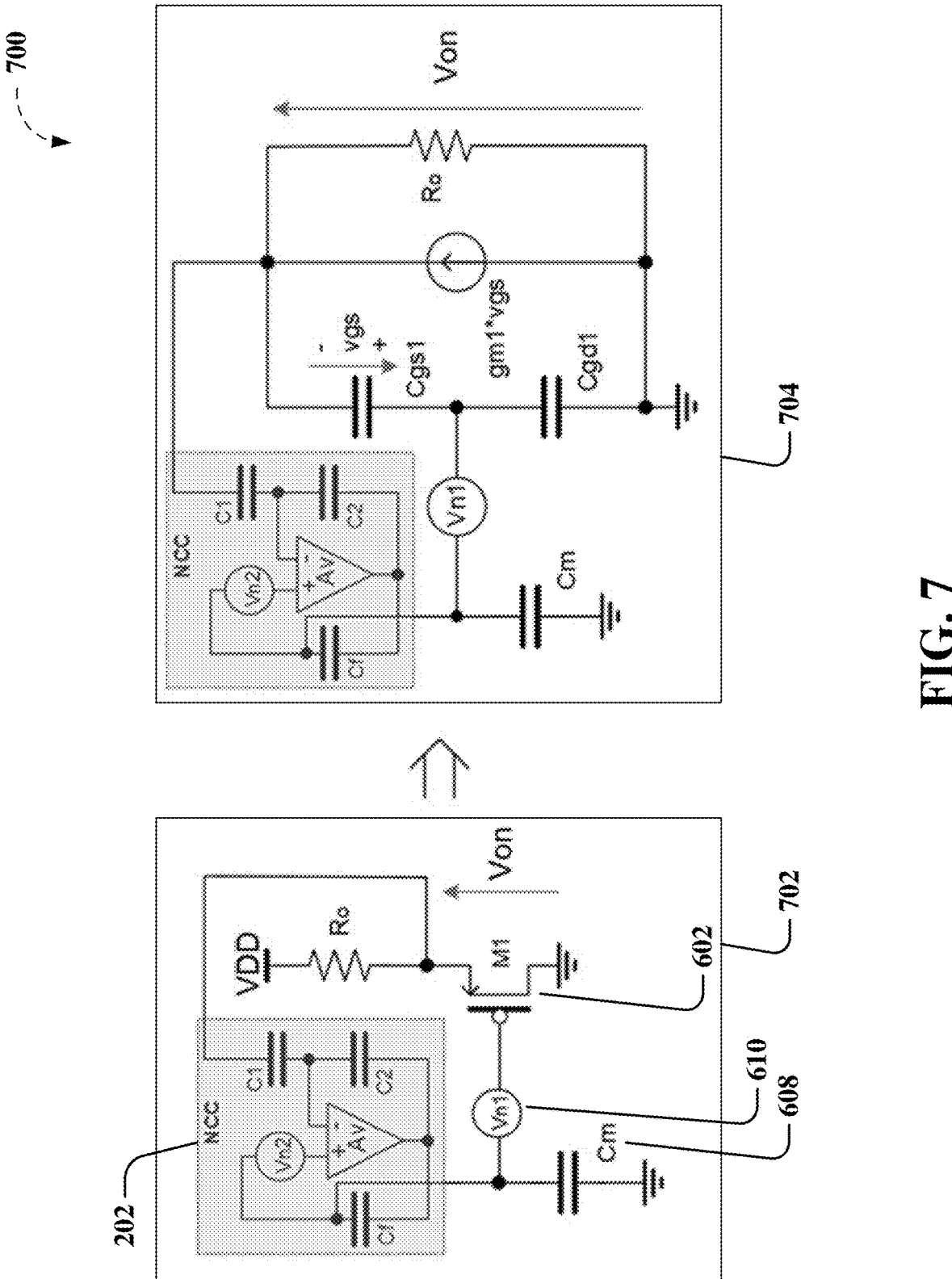
FIG. 7 depicts another non-limiting block diagram of exemplary aspects of a NIC implemented in a bootstrap loop of a single transistor source follower readout interface for an exemplary capacitive sensor, according to various embodiments described herein.

FIG. 6 depicts a functional block diagram of an exemplary operating environment 600 comprising a single transistor M1 602 source follower readout interface 604 suitable for incorporation of various non-limiting aspects of the subject disclosure, with the equivalent circuit 606 of the single transistor M1 602 source follower read out interface 604, where capacitive sensor 102 capacitance, $C_m$ 608, and transistor noise $V_{n1}$ 610 is illustrated. FIG. 7 depicts another non-limiting block diagram 700 of exemplary aspects of a NIC or NCC 202 (equivalent circuit, NIC or NCC 208) implemented in a bootstrap loop of the single transistor M1 602 source follower readout interface 702, with the equivalent circuit 704, for an exemplary capacitive sensor 102, according to various embodiments described herein.

Figure 8:
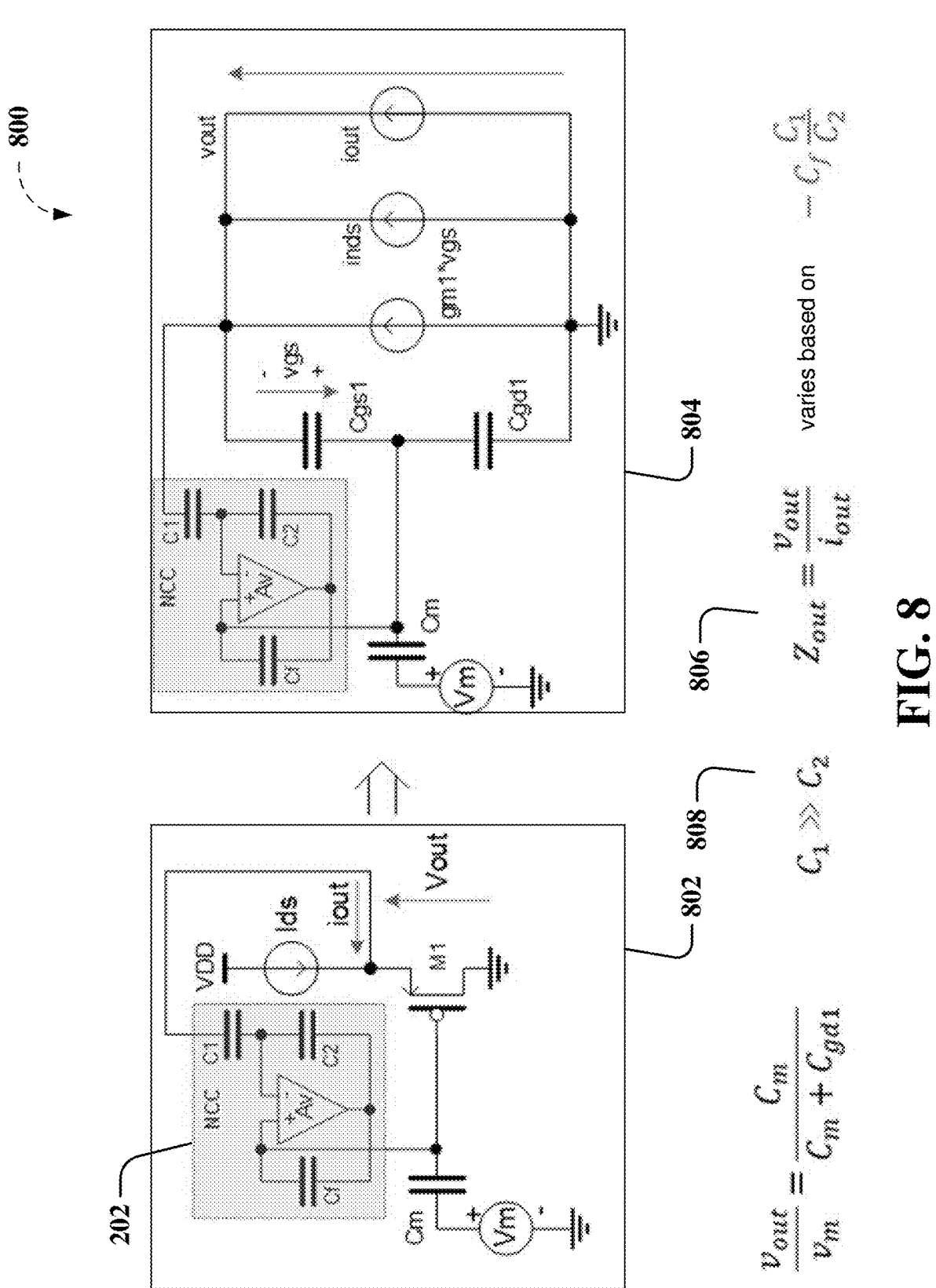
FIG. 8 depicts a further non-limiting block diagram of a NIC implemented in a bootstrap loop of a low impedance readout interface for an exemplary capacitive sensor, according to further embodiments described herein.

FIG. 8 depicts a further non-limiting block diagram 800 of a NIC or NCC 202 (equivalent circuit, NIC or NCC 208) implemented in a bootstrap loop of a low impedance readout interface (e.g., single transistor M1 602 source follower readout interface 802 and equivalent circuit 804) for an exemplary capacitive sensor 102, according to further embodiments described herein. As can be seen in FIG. 8, output impedance $Z_{out}$ 806 can be shown to vary based on $-C_fC_1/C_2$, which, for $C_1$ much greater than $C_2$ as in 808, provides a low noise, low output impedance readout interface for an exemplary capacitive sensor 102.

Figure 9:
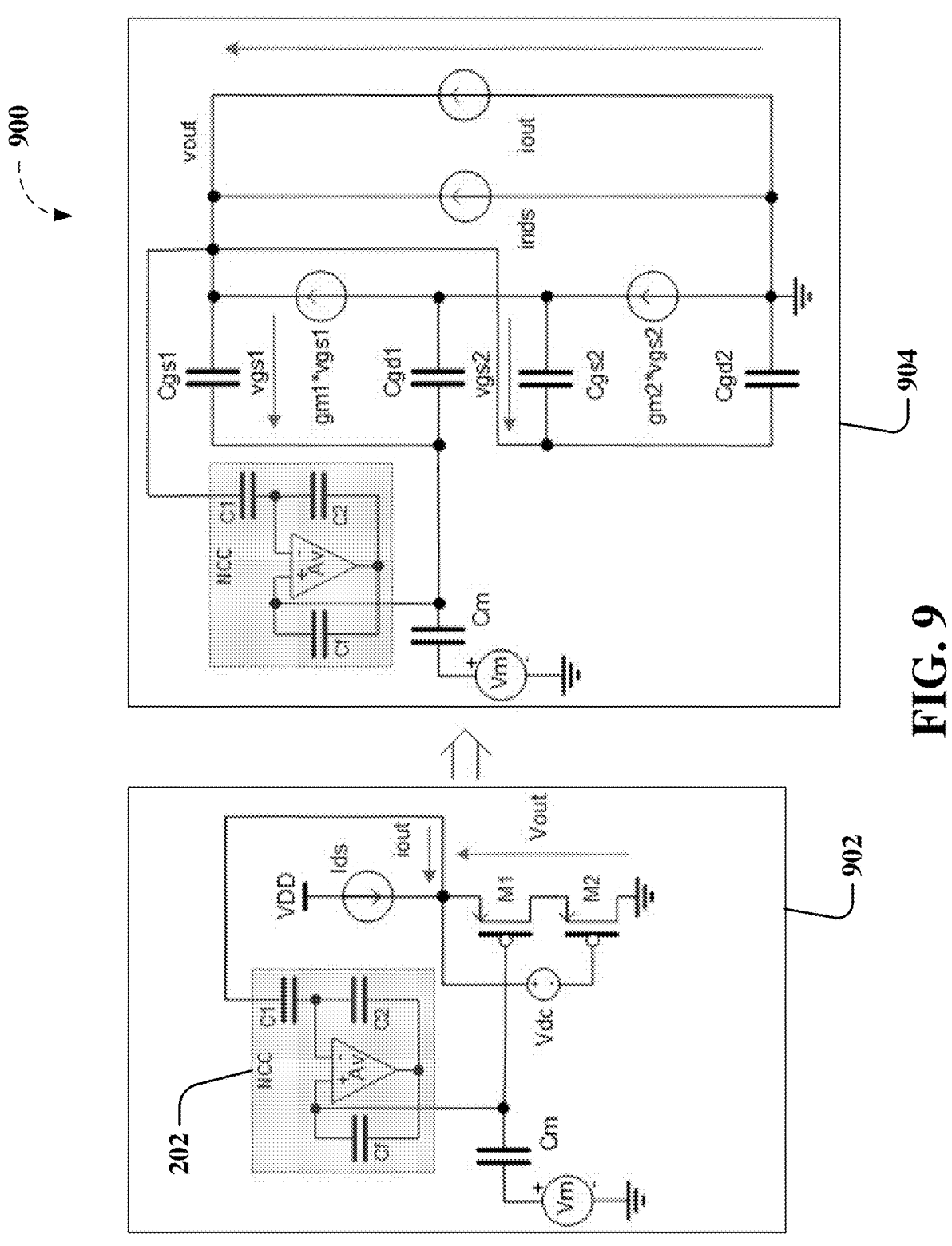
FIG. 9 depicts still another non-limiting block diagram of a NIC implemented in a bootstrap loop of a low impedance readout interface for an exemplary capacitive sensor, according to further embodiments described herein.

FIG. 9 depicts still another non-limiting block diagram 900 of a NIC or NCC 202 (equivalent circuit, NIC or NCC 208) implemented in a bootstrap loop of a low impedance readout interface comprising a source follower with source biased self-cascode (M2) 902, for an exemplary capacitive sensor 102, with equivalent circuit 904, according to further embodiments described herein. As in FIG. 8, output impedance $Z_{out}$ can be shown to vary based on $-C_fC_1/C_2$, which, for $C_1$ much greater than $C_2$, provides a low noise, low output impedance readout interface for an exemplary capacitive sensor 102.

Figure 10:
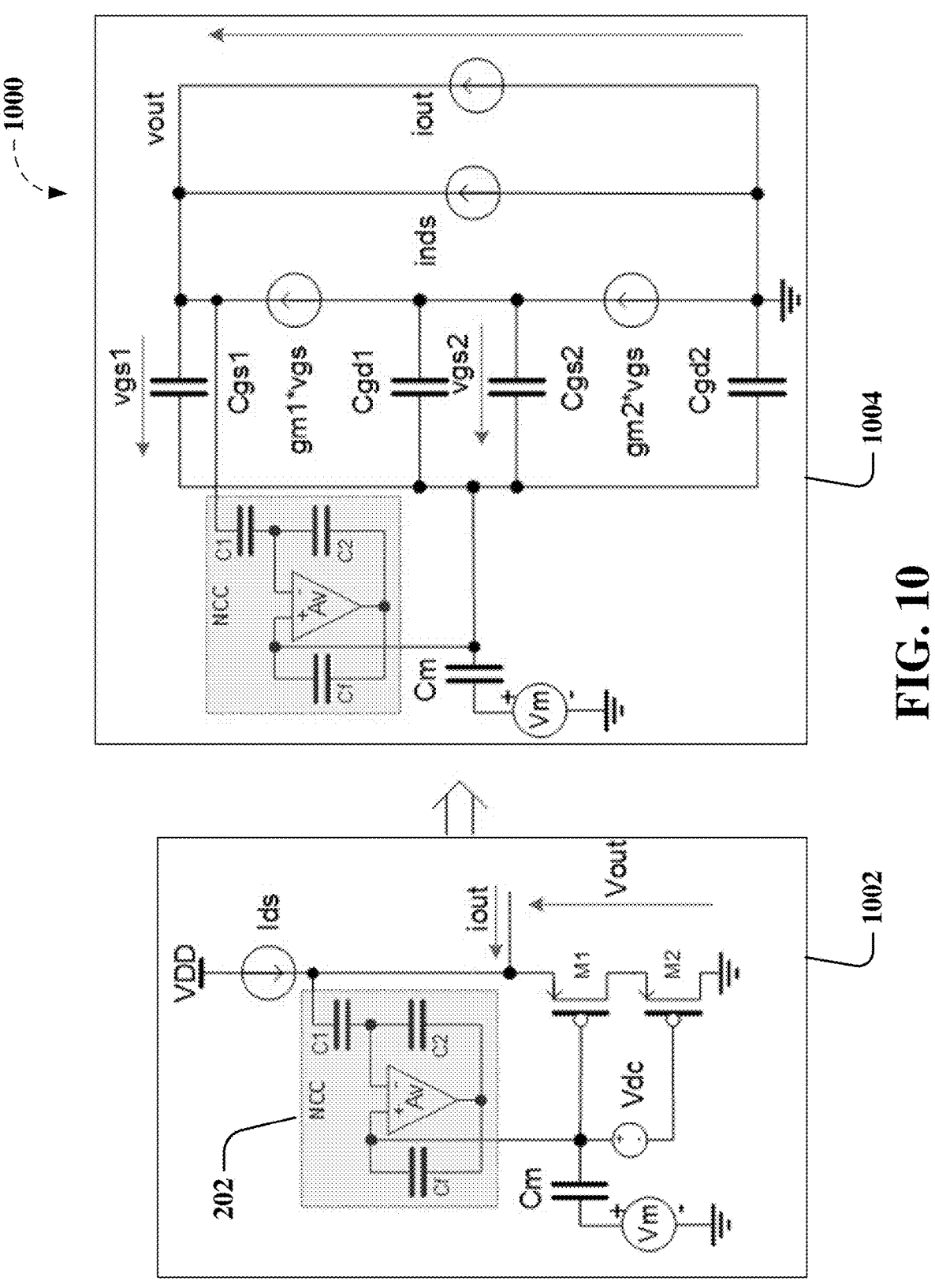
FIG. 10 depicts yet another non-limiting block diagram of a NIC implemented in a bootstrap loop of a low impedance readout interface for an exemplary capacitive sensor, according to further embodiments described herein.
Figure 11:
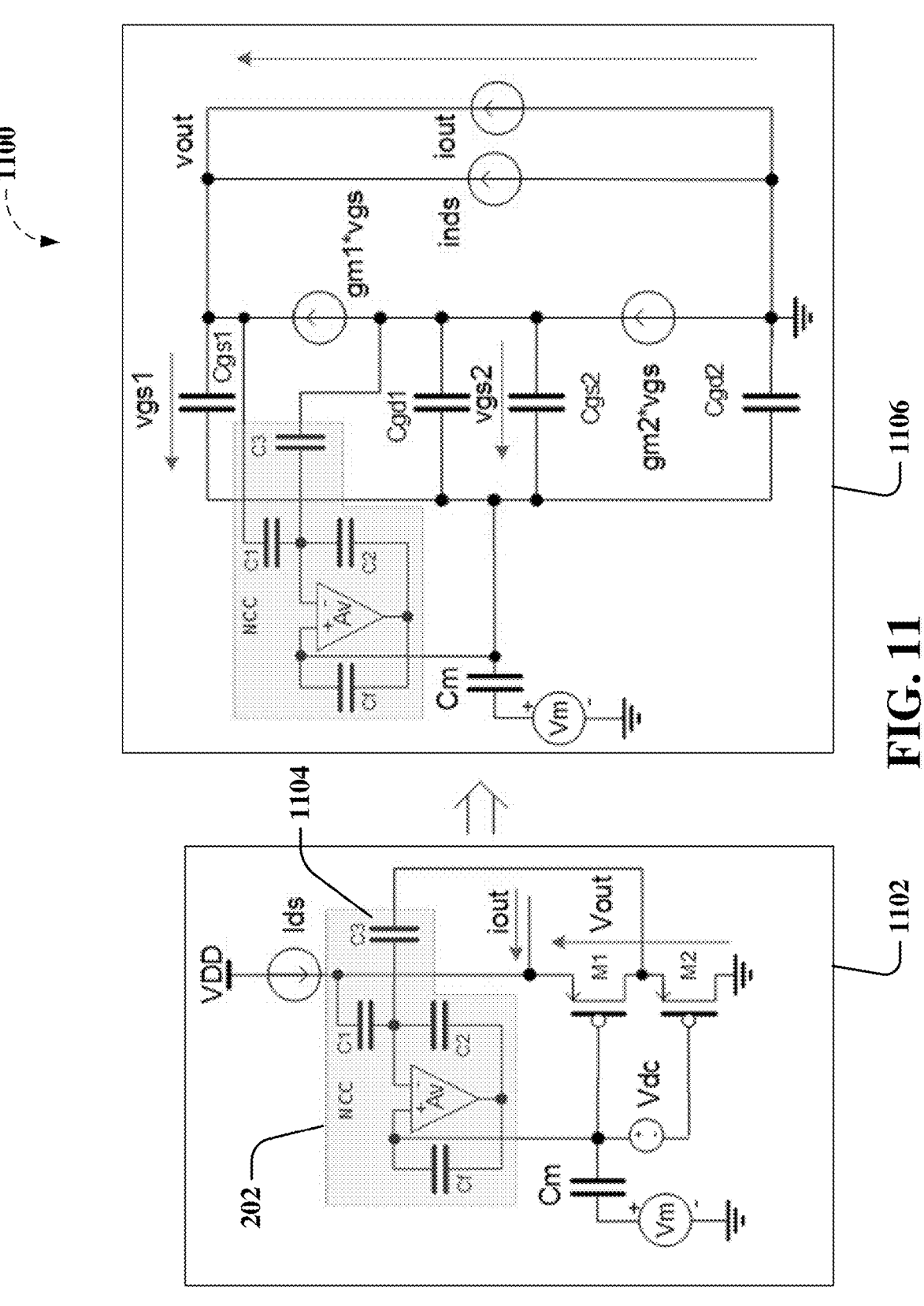
FIG. 11 depicts another non-limiting block diagram of a NIC implemented in a bootstrap loop of a low impedance readout interface for an exemplary capacitive sensor, according to further embodiments described herein.

FIG. 10 depicts yet another non-limiting block diagram 1000 of a NIC or NCC 202 (equivalent circuit, NIC or NCC 208) implemented in a bootstrap loop of a low impedance readout interface comprising a source follower with gate biased self-cascode (M2) 1002, for an exemplary capacitive sensor 102, with equivalent circuit 1004, according to further embodiments described herein. As in FIGS. 8-9, output impedance $Z_{out}$ can be shown to vary based on $-C_fC_1/C_2$, which, for $C_1$ much greater than $C_2$, provides a low noise, low output impedance readout interface for an exemplary capacitive sensor 102. FIG. 11 depicts another non-limiting block diagram 1100 of a NIC or NCC 202 (equivalent circuit, NIC or NCC 208) implemented in a bootstrap loop of a low impedance readout interface comprising a source follower with gate biased self-cascode (M2) 1102 (as in FIG. 10), with an added capacitance $C_3$ 1104, to mitigate noise contribution from M2, with equivalent circuit 1106, for an exemplary capacitive sensor, according to further embodiments described herein. As in FIGS. 8-10, output impedance $Z_{out}$ can be shown to vary based on $-C_fC_1/C_2$, in addition to output impedance $Z_{out}$ varying based on $-C_fC_3/C_2$, which, for $C_1$ much greater than $C_2$, provides a low noise, low output impedance readout interface for an exemplary capacitive sensor 102.

Regarding FIGS. 8-11, single transistor M1 602 source follower readout interface 702/802 employing an exemplary NIC or NCC 202 (equivalent circuit, NIC or NCC 208) as described herein can provide a reasonable reduction in noise of an exemplary AFE for a capacitive sensor where a differential architecture is not desired, since noise from the buffer is only the issue, and it avoids residual noise contributions from the self-cascode and inverting amplifier. Further regarding FIGS. 8-11, a NIC or NCC 202 (equivalent circuit, NIC or NCC 208) employing an extra capacitance $C_3$ for both AFE architectures (gate-controlled self-cascode in FIG. 11 and source-controlled self-cascode of FIG. 9 (extra capacitance $C_3$ not shown)) can provide further reductions in residual noise contribution from the self-cascode configurations, according to further non-limiting aspects.

In various non-limiting embodiments, optimization of an exemplary NIC or NCC 202 (equivalent circuit, NIC or NCC 208) implemented in a bootstrap loop of a low impedance readout interface for an exemplary capacitive sensor 102 as described herein can include minimization of NIC or NCC 202 (equivalent circuit, NIC or NCC 208) by increasing $C_1$, subject to chip area limitations, output impedance $Z_{out}$, and stability issues due to positive feedback, for example, whereas $C_2$ should be kept small (e.g., approximately 10 and 100 times lower than $C_1$). In a further non-limiting aspect, $C_f$ can be selected based on the exemplary NIC or NCC 202 (equivalent circuit, NIC or NCC 208) and the device under noise improvement (DUNI) (e.g., AFE, capacitive sensor) by considering the noise introduced by or NCC 202 (equivalent circuit, NIC or NCC 208) (where $C_1$ would be increased), while considering that the poles and zeros go down over frequency of the DUNI as well (e.g., assuming poles and zeros are well beyond 20 kHz, resulting in flat impedance characteristic within the audio band).

Accordingly, various non-limiting embodiments as described herein can provide low noise capacitive sensor 102 readout interfaces or AFE that can result in noise reduction by employing exemplary NIC or NCC 202 (equivalent circuit, NIC or NCC 208) that can be applied to any continuous-time architecture, such as simple single-ended solutions, pseudo-differential ones and the like.

For instance, various non-limiting embodiments as described herein, for example, regarding FIGS. 4-11, can comprise a source follower sensor readout interface (e.g., as described herein regarding FIGS. 4-11) comprising a main buffer amplifier (e.g., main buffer amplifier 308), wherein the main buffer amplifier (e.g., main buffer amplifier 308) can be configured in a bootstrap configuration at an output of a capacitive sensor (e.g., capacitive sensor 102). In further non-limiting embodiments, a bootstrap loop of the bootstrap configuration can comprise a negative capacitance (e.g., negative equivalent capacitance 210) coupled to an input of the main buffer amplifier (e.g., main buffer amplifier 308), wherein the bootstrap configuration comprising a negative capacitance (e.g., negative equivalent capacitance 210) at the input of the main buffer amplifier (e.g., main buffer amplifier 308) can be configured to reduce noise associated with the source follower sensor readout interface (e.g., as described herein regarding FIGS. 4-11) and that is attributable to the main buffer amplifier (e.g., main buffer amplifier 308).

For instance, as further described herein, an exemplary bootstrap configuration comprising the negative capacitance (e.g., negative equivalent capacitance 210) can comprise a negative capacitance converter (e.g., NIC or NCC 202 (equivalent circuit, NIC or NCC 208)). In further non-limiting examples, the exemplary negative capacitance converter (e.g., NIC or NCC 202 (equivalent circuit, NIC or NCC 208)) can comprise a negative impedance converter (NIC) buffer amplifier (e.g., NIC or NCC 202 op-amp 206) configured to balance noise associated with the NIC buffer amplifier (e.g., NIC or NCC 202 op-amp 206) with noise associated the main buffer amplifier (e.g., main buffer amplifier 308) to increase signal-to-noise (SNR) of the source follower sensor readout interface (e.g., as described herein regarding FIGS. 4-11).

In still further non-limiting examples, the exemplary negative capacitance converter (e.g., NIC or NCC 202 (equivalent circuit, NIC or NCC 208)) can be coupled to the main buffer amplifier (e.g., main buffer amplifier 308) at the input to the main buffer amplifier (e.g., main buffer amplifier 308). In a non-limiting aspect, the exemplary negative capacitance converter (e.g., NIC or NCC 202 (equivalent circuit, NIC or NCC 208)) can be coupled to the input of the main buffer amplifier (e.g., main buffer amplifier 308) in the bootstrap loop, for example, as further described herein regarding FIGS. 4-11.

In another non-limiting aspect, the bootstrap loop can be configured to provide a reduction of source follower sensor readout interface (e.g., as described herein regarding FIGS. 4-11) output impedance ($Z_{out}$) based at least in part on the negative capacitance (e.g., negative equivalent capacitance 210). In addition, as further described herein, the bootstrap configuration comprising the negative capacitance (e.g., negative equivalent capacitance 210) at the input of the main buffer amplifier (e.g., main buffer amplifier 308) can be configured to lower output impedance ($Z_{out}$) associated with the source follower sensor readout interface as a result of an additional capacitance located between the negative capacitance and the source follower sensor readout interface (e.g., as described herein regarding FIG. 11). In still further non-limiting aspects, exemplary source follower sensor readout interface (e.g., as described herein regarding FIGS. 4-11) can comprise a MEMS acoustic sensor or microphone 102 readout interface.

Returning again to FIG. 2, FIG. 2 depicts a source follower readout interface of a capacitive sensor 102 with a bootstrap loop, suitable for incorporation of various aspects of the disclosed subject matter. For instance, FIG. 12 depicts a non-limiting block diagram 1200 of exemplary aspects of a NIC 208 coupled between ground 1202 and a readout interface for an exemplary capacitive sensor 102, according to still further embodiments described herein.

Figure 12:
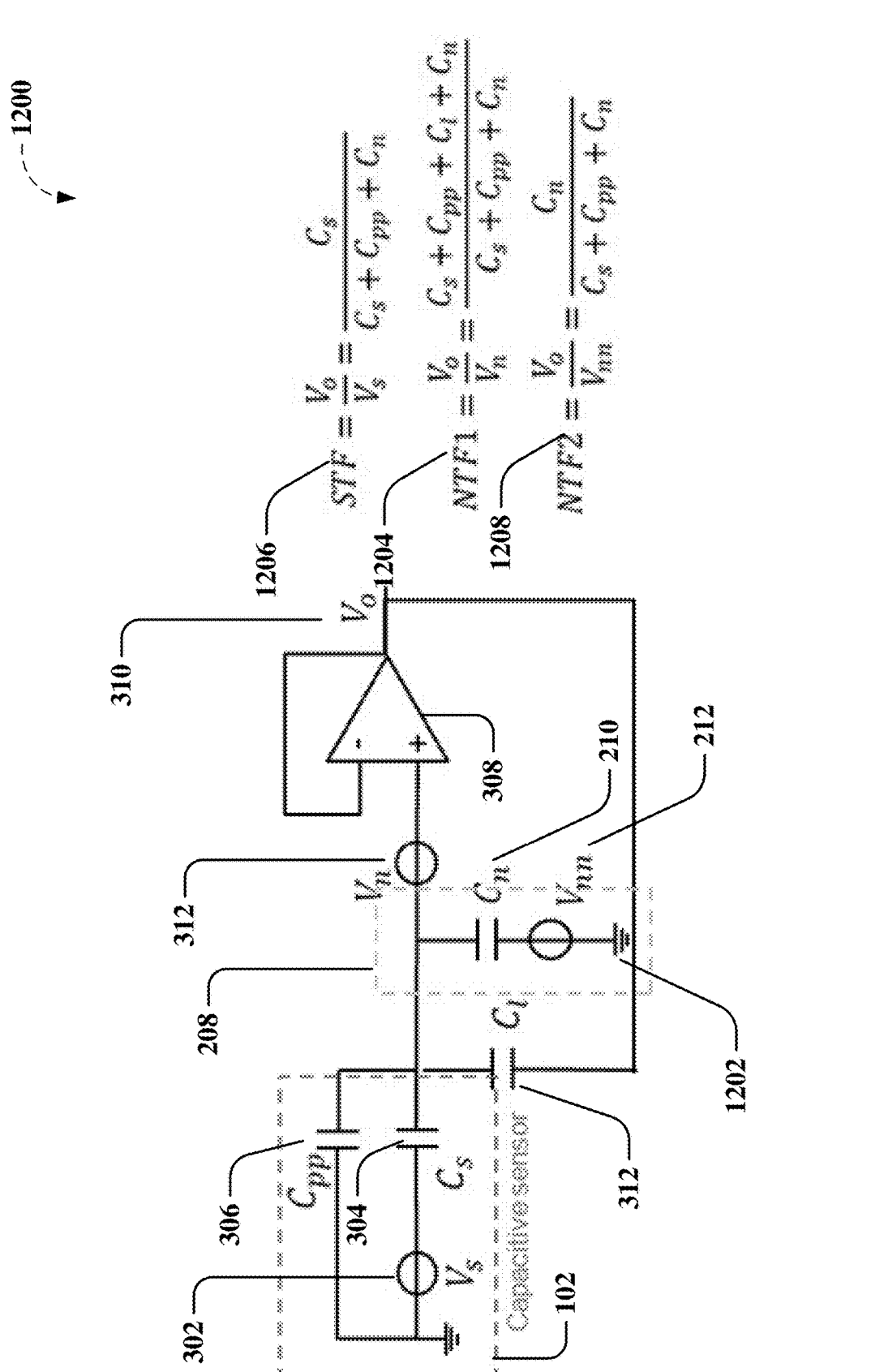
FIG. 12 depicts a non-limiting block diagram of exemplary aspects of a NIC coupled between ground and a readout interface for an exemplary capacitive sensor, according to still further embodiments described herein.

Note that, as shown in FIG. 12, the negative equivalent capacitance, $C_n$ 210, of the NIC does not only appear in the numerator of noise transfer function 1, NTF1 1204, of FIG. 12, it also appears in the denominator of the noise transfer function 1, NTF1 1204, of FIG. 12, and it also appears in the denominator of the signal transfer function, STF 1206, of FIG. 12. Thus, by varying negative equivalent capacitance, $C_n$ 210, the STF 1206 can be effected to provide at least one of a signal gain or signal attenuation for an output signal or readout interface signal $V_o$ 310 associated with the capacitive sensor 102 noise source or noise generator $V_s$ 302, for example, as further described herein regarding FIGS. 13 and 16.

Figure 13:
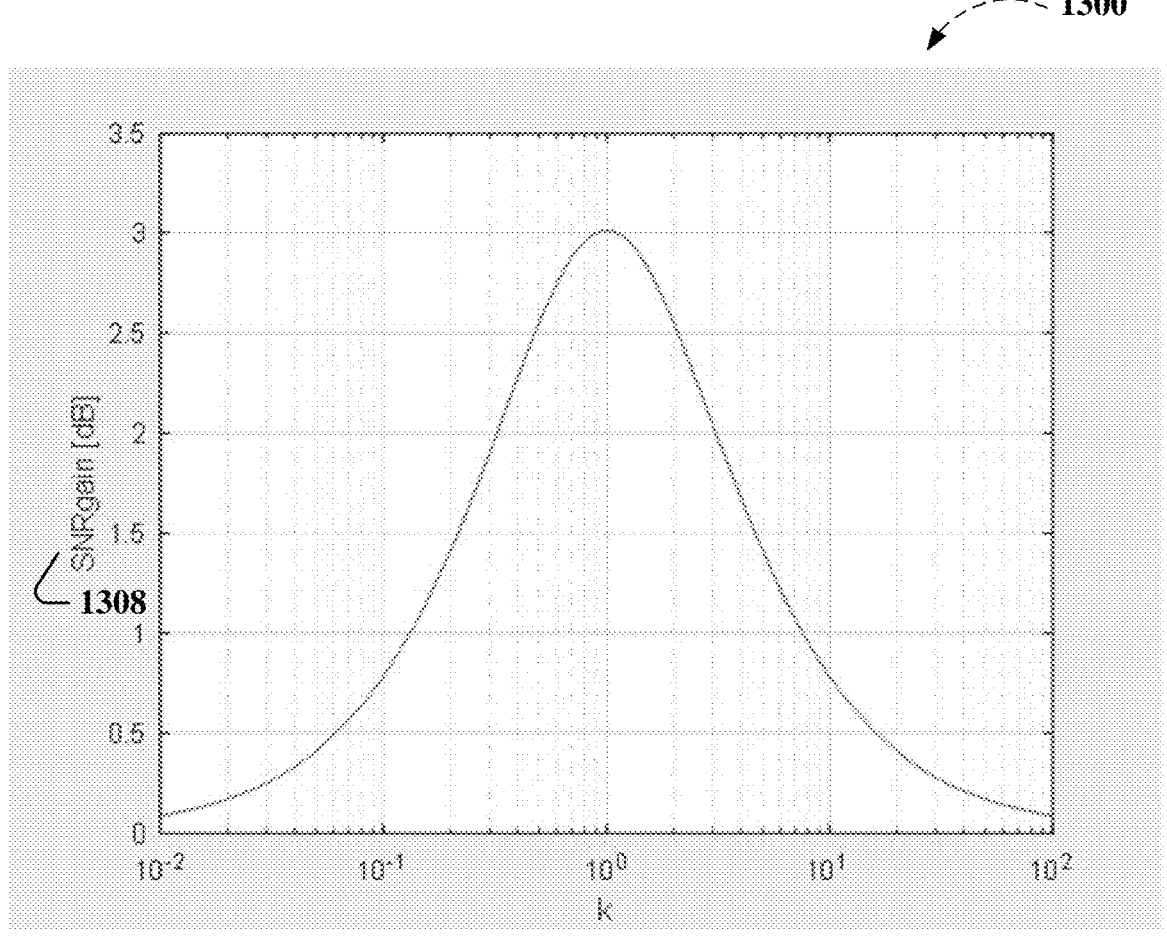
FIG. 13 demonstrates the SNR performance for the non-limiting block diagram of the NIC coupled between ground and a readout interface for an exemplary capacitive sensor of FIG. 12, according to various embodiments described herein.

FIG. 13 demonstrates the SNR performance 1300 for the non-limiting block diagram 1200 of the NIC coupled between ground and a readout interface for an exemplary capacitive sensor 102 of FIG. 12, according to various embodiments described herein. Assuming the square of noise generator or noise source, $V_{nn}$ 214, is as shown in 1302, the noise power spectral density (NoisePSD) is given in relationship 1304, the minimization of which results in an optimal negative equivalent capacitance, $C_n$ 210, similar to that described above regarding FIGS. 4-5. Assuming k is null (ideal case), the negative equivalent capacitance, $C_n$ 210, is the negative of the sum of the variable capacitance output, $C_s$ 304 associated with the capacitive sensor 102, the possible parasitic capacitances, $C_{pp}$ 306, and the $C_1$ 314 (e.g., possible capacitances affecting the input of the readout interface), which results in the numerator of NTF1 1204 being zero, with the addition of NTF2 1208 from negative equivalent capacitance, $C_n$ 210 being non-zero. In the real case, k is not null and the noise from the source follower readout interface of a capacitive sensor 102 with a bootstrap loop incorporating a NIC 208 coupled between ground 1202 and the input of the buffer amplifier 308 of FIG. 12 is as shown in FIG. 13, which optimizes the SNR.

Note further in FIG. 13 from the depiction of the SNR gain 1308 (which represents the improvement in SNR 1306 from the embodiment of FIG. 12 over that of the embodiment of FIG. 3) that, for any values of $V_{nn}$ 214 (e.g., noise added by NIC or NCC 208 between ground and the main buffer amplifier 308), e.g., noise added by incorporating a NIC 208 coupled between ground and the input of the buffer amplifier 308, the SNR 1306 is at least not degraded. In a non-limiting aspect, when the added noise, $V_{nn}$ 214, is the same as the main buffer amplifier noise, $V_n$ 312, of the source follower or main buffer amplifier, e.g., k=1, then SNR 1306 can be improved at best by 3 dB, with respect to the exemplary operating environment of FIG. 3, whereas STF 1206 can be increased greater than 6 dB, enabling the potential for effecting a STF 1206 gain change (e.g., amplify or attenuate noise source or noise generator $V_s$ 302 associated with capacitive sensor 102), according to still further non-limiting aspects, as further described herein regarding FIG. 16.

That is, because STF 1206 depends on negative equivalent capacitance, $C_n$ 210, there is a potential for a gain adjustment on noise source or noise generator $V_s$ 302 (e.g., amplify or attenuate noise source or noise generator $V_s$ 302 associated with capacitive sensor 102), according to various non-limiting embodiments. Because equivalent capacitance, $C_n$ 210, is negative, contribution of buffer amplifier noise, $V_n$ 312, can be canceled and/or attenuated by the negative equivalent capacitance, $C_n$ 210, at the expense of additional noise from the added NIC 208 coupled between ground and the input of the main buffer amplifier 308 of the source follower readout interface of a capacitive sensor 104 with a bootstrap loop as shown in FIG. 12.

Referring again to FIG. 6, FIG. 6 depicts a functional block diagram of an exemplary operating environment 600 comprising a single transistor M1 602 source follower readout interface 604 suitable for incorporation of various non-limiting aspects of the subject disclosure, with the equivalent circuit 606 of the single transistor M1 602 source follower read out interface 604, where capacitive sensor 102 capacitance, $C_m$ 608, and transistor noise $V_{n1}$ 610 is illustrated.

Figure 14:
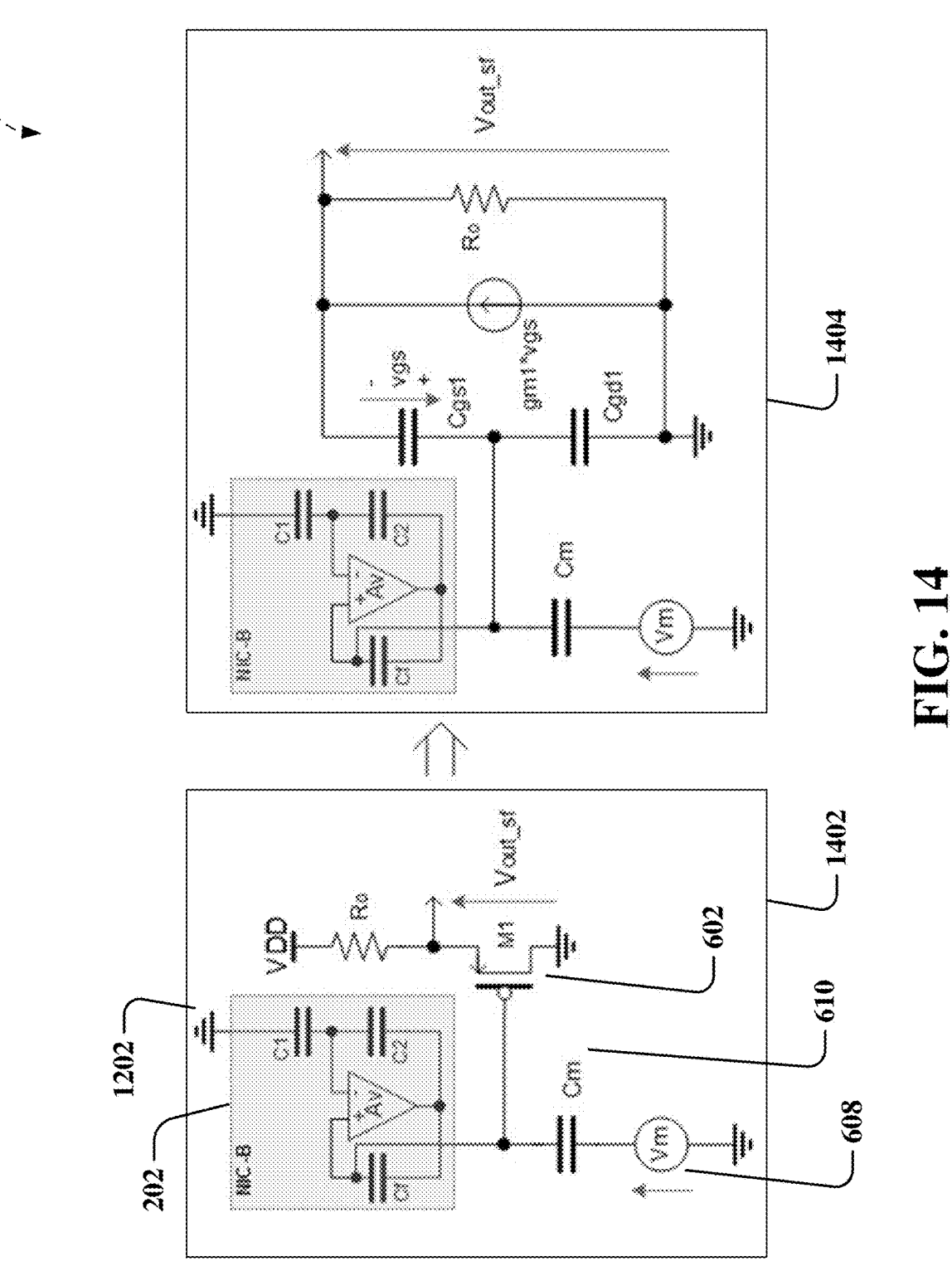
FIG. 14 depicts another non-limiting block diagram of exemplary aspects of a NIC coupled between ground and a single transistor source follower readout interface for an exemplary capacitive sensor, according to various embodiments described herein.

FIG. 14 depicts another non-limiting block diagram 1400 of exemplary aspects of a NIC or NCC 202 (equivalent circuit, NIC or NCC 208) coupled between ground 1202 and a single transistor M1 602 source follower readout interface 1402, with the equivalent circuit 1404, for an exemplary capacitive sensor 102, according to disclosed embodiments, as further described herein, regarding FIGS. 6 and 12-13.

Figure 15:
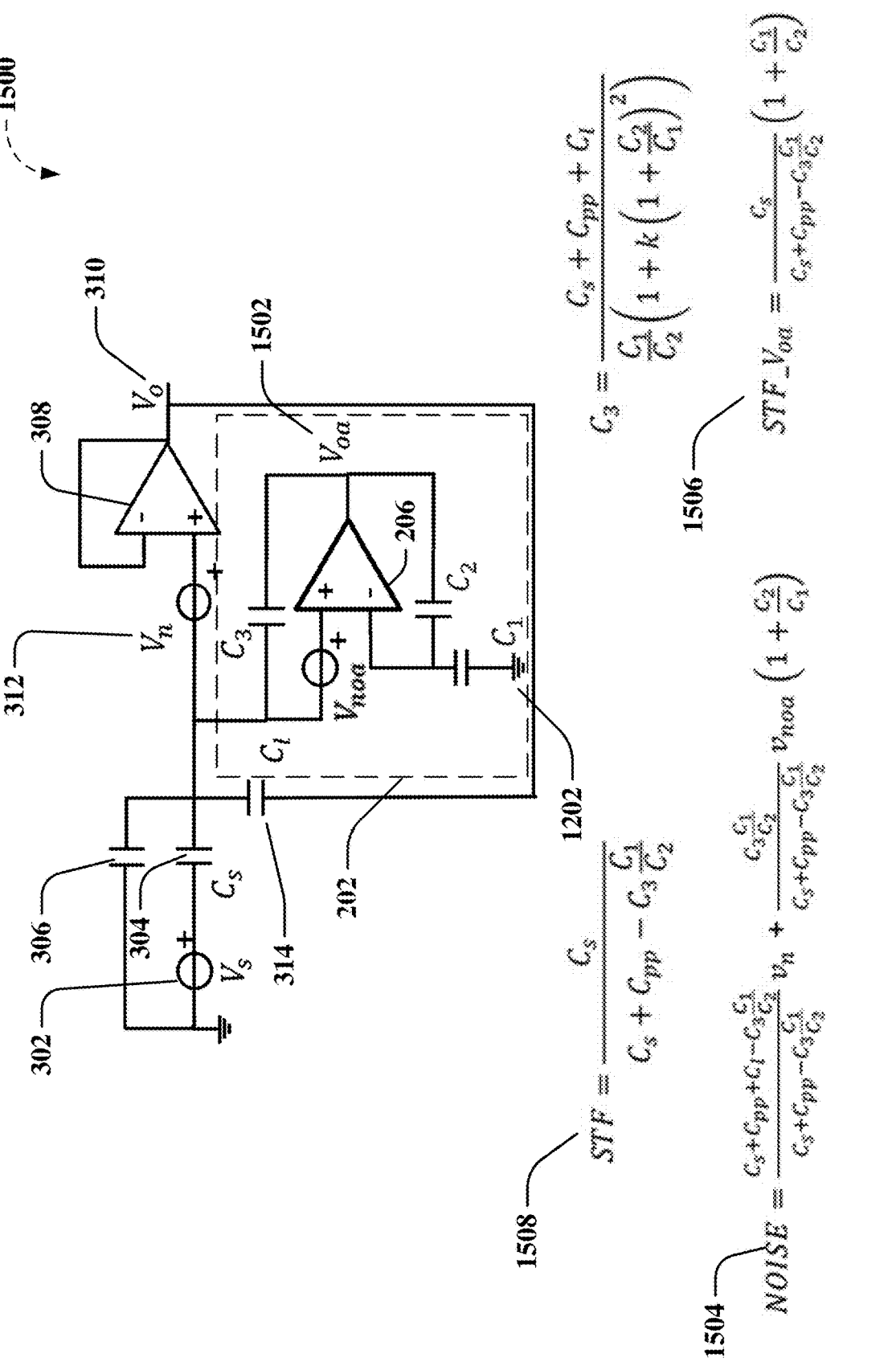
FIG. 15 depicts another non-limiting block diagram of exemplary aspects of a NIC coupled between ground and a single transistor source follower readout interface for an exemplary capacitive sensor and considerations of balancing noise performance and signal distortion, according to various embodiments described herein.

FIG. 15 depicts another non-limiting block diagram 1500 of exemplary aspects of a NIC 202 coupled between ground 1202 and a single transistor M1 602 source follower readout interface for an exemplary capacitive sensor 102 and considerations of balancing noise performance and signal distortion, according to various embodiments described herein. For instance, it can be understood that for different combinations of capacitances (e.g., $C_1$, $C_2$, $C_3$) as a result of optimization of the NIC or NCC 202, the swing of the output $V_{oa}$ 1502 of the op-amp 206 can result in potential signal distortion. Accordingly, in further non-limiting aspects, minimization of the introduced noise 1504 of the NIC or NCC 202 (e.g., by selection of a $C_1$ that is much greater than $C_2$) can be balanced with maintaining the stability of the output $V_{oa}$ 1502 of the op-amp 206 (e.g., STF_$V_{oa}$ 1506), to minimize potential for output $V_{oa}$ 1502 of the op-amp 206 signal distortion while, limiting SNR (e.g., ratio of STF 1504 to noise 1504) degradation, for example, as further described below regarding FIG. 16.

Figure 16:
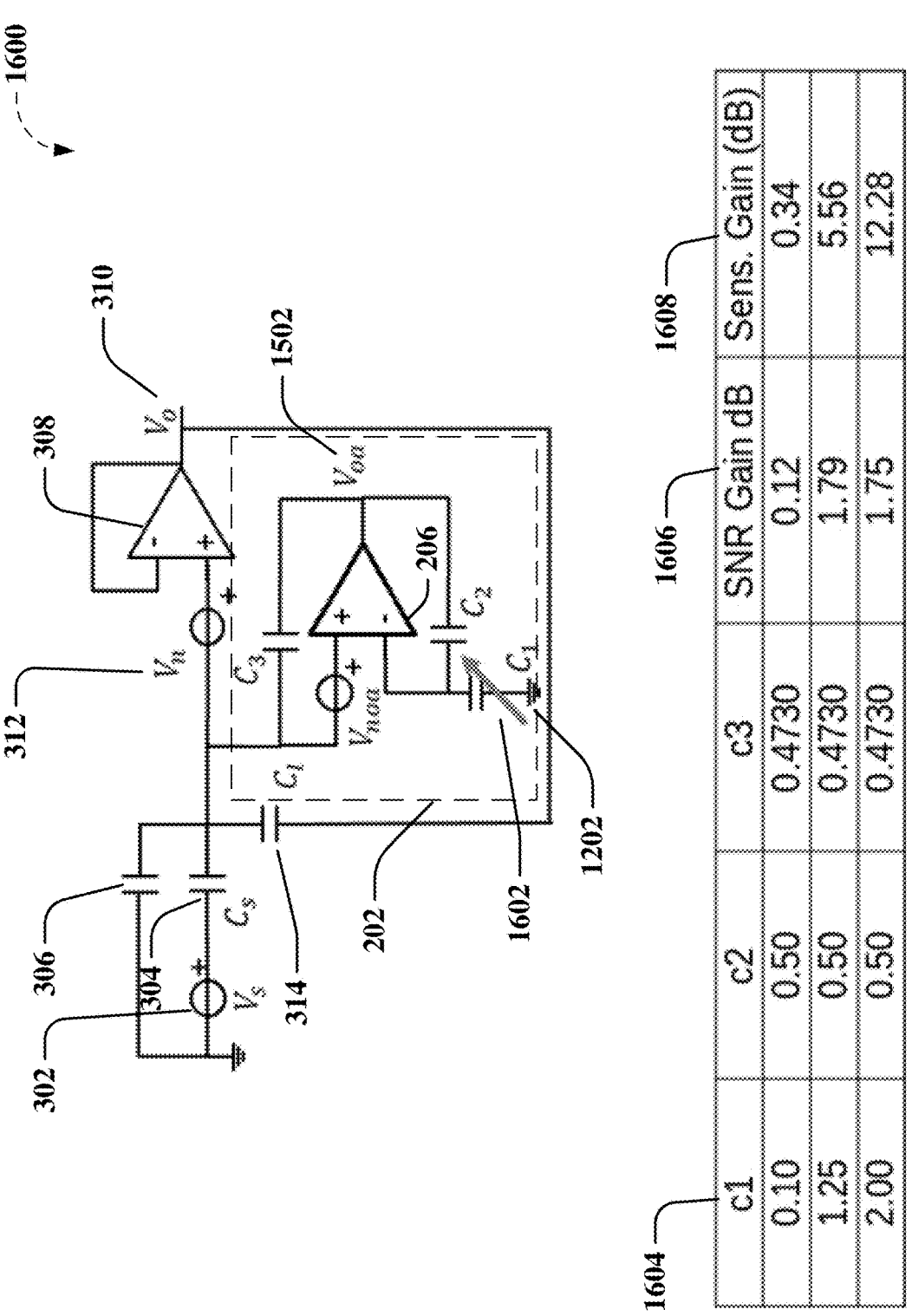
FIG. 16 depicts another non-limiting block diagram of exemplary aspects of a NIC coupled between ground and a single transistor source follower readout interface for an exemplary capacitive sensor, which facilitates providing a signal gain or signal attenuation of an output signal associated with the capacitive sensor, according to various embodiments described herein.

FIG. 16 depicts another non-limiting block diagram 1600 of exemplary aspects of a NIC 202 coupled between ground 1202 and a single transistor M1 602 source follower readout interface for an exemplary capacitive sensor 102 as in FIG. 15, with a variable capacitance $C_n$ 1602, which facilitates providing a signal gain or signal attenuation of an output signal associated with the capacitive sensor 102, according to various embodiments described herein. In a non-limiting aspect, as capacitance $C_1$ 1602 is varied as shown 1604, for example, the SNR Gain 1606 remains relatively unchanged, whereas the Sensitivity Gain 1608 or STF 1508 can be varied to provide one or more of a signal gain or signal attenuation for an output signal or readout interface signal, $V_o$ 310, associated with the capacitive sensor 102 noise source or noise generator $V_s$ 302. Providing a variable capacitance $C_1$ 1602, can include switching among a bank of capacitors or other techniques available in the art. Accordingly, further non-limiting embodiments can comprise an AGC controller component (not shown) associated with the capacitive sensor 102 readout interface that can be configured to adjust one or more of the signal gain or signal attenuation of the capacitive sensor 102 readout interface for the output signal or readout interface signal, $V_o$ 310, associated with the capacitive sensor 102. As described above, whereas a conventional AGC component typically acts to determine gain of the one or more amplifier or gain stage 106, as used herein, an AGC component is described as facilitating adjustment of one or more of a signal gain or signal attenuation of particular sensor readout interfaces for the output signal or readout interface signal, $V_o$ 310, associated with the capacitive sensor 102, e.g., at the output of the one or more components or circuitry 104 (e.g., one or more components or circuitry 104, etc., sometimes referred to, herein, as "front end" or "analog front end").

Accordingly, further non-limiting embodiments as described herein, for example, regarding FIGS. 12-16, can comprise a source follower sensor readout interface (e.g., as described herein regarding FIGS. 12-16) comprising a main buffer amplifier (e.g., main buffer amplifier 308), wherein the main buffer amplifier (e.g., main buffer amplifier 308) can be configured in a bootstrap configuration at an output of a capacitive sensor (e.g., capacitive sensor 102). In further non-limiting embodiments, a bootstrap loop of the bootstrap configuration can comprise a negative capacitance (e.g., negative equivalent capacitance 210) coupled to an input of the main buffer amplifier (e.g., main buffer amplifier 308), wherein the bootstrap configuration comprising a negative capacitance (e.g., negative equivalent capacitance 210) at the input of the main buffer amplifier (e.g., main buffer amplifier 308) can be configured to reduce noise associated with the source follower sensor readout interface (e.g., as described herein regarding FIGS. 12-16) and that is attributable to the main buffer amplifier (e.g., main buffer amplifier 308).

For instance, as further described herein, an exemplary bootstrap configuration comprising the negative capacitance (e.g., negative equivalent capacitance 210) can comprise a negative capacitance converter (e.g., NIC or NCC 202 (equivalent circuit, NIC or NCC 208)). In further non-limiting examples, the exemplary negative capacitance converter (e.g., NIC or NCC 202 (equivalent circuit, NIC or NCC 208)) can be coupled to the main buffer amplifier (e.g., main buffer amplifier 308) at the input to the main buffer amplifier (e.g., main buffer amplifier 308).

In various embodiments described herein, the exemplary negative capacitance converter (e.g., NIC or NCC 202 (equivalent circuit, NIC or NCC 208)) can be coupled between the input of the main buffer amplifier (e.g., main buffer amplifier 308) and ground 1202, for example, as further described herein, regarding FIGS. 12-16. In another non-limiting aspect, the bootstrap loop can be configured to provide one or more of a signal gain or signal attenuation for an output signal ($V_o$ 310) associated with the capacitive sensor (e.g., capacitive sensor 102), as further described herein regarding FIGS. 15-16. In still further non-limiting aspects, exemplary source follower sensor readout interface (e.g., as described herein regarding FIGS. 4-11) can comprise a MEMS acoustic sensor or microphone 102 readout interface.

In addition, as further described herein regarding FIGS. 15-16, exemplary embodiments can comprise an automatic gain control (AGC) controller component (not shown) associated with the source follower sensor readout interface (e.g., as described herein regarding FIGS. 12-16) configured to adjust the one or more of the signal gain or signal attenuation of the source follower sensor readout interface for the output signal ($V_o$ 310). For instance, an AGC controller component (not shown) can be configured to apply one or more of a predetermined set of capacitances (e.g., variable $C_1$) in the negative capacitance converter (e.g., NIC or NCC 202 (equivalent circuit, NIC or NCC 208)) to adjust the one or more of the signal gain or the signal attenuation.

In view of the subject matter described supra, methods that can be implemented in accordance with the subject disclosure will be better appreciated with reference to the flowchart of FIG. 17. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

EXEMPLARY METHODS

FIG. 17 depicts an exemplary flowchart of non-limiting methods 1700 associated with a various non-limiting embodiments of the subject disclosure. For example, at 1702, exemplary methods 1700 can comprise applying a negative capacitance (e.g., negative equivalent capacitance 210) at an input of a main buffer amplifier (e.g., main buffer amplifier 308) in a source follower sensor readout interface (e.g., as described herein regarding FIGS. 4-16) associated with a capacitive sensor (e.g., capacitive sensor 102), wherein the main buffer amplifier (e.g., main buffer amplifier 308) is configured in a bootstrap configuration at an output of the capacitive sensor (e.g., capacitive sensor 102), in a non-limiting aspect. As a non-limiting example, applying the negative capacitance (e.g., negative equivalent capacitance 210) at the input of the main buffer amplifier (e.g., main buffer amplifier 308) in the source follower sensor readout interface (e.g., as described herein regarding FIGS. 4-16) can comprise applying the negative capacitance (e.g., negative equivalent capacitance 210) via a negative capacitance converter (e.g., NIC or NCC 202 (equivalent circuit, NIC or NCC 208)) coupled to the main buffer amplifier (e.g., main buffer amplifier 308) at the input to the main buffer amplifier (e.g., main buffer amplifier 308), as further described above regarding FIGS. 4-16.

In another non-limiting aspect, applying the negative capacitance (e.g., negative equivalent capacitance 210) via the negative capacitance converter (e.g., NIC or NCC 202 (equivalent circuit, NIC or NCC 208)) can comprise applying the negative capacitance (e.g., negative equivalent capacitance 210) via the negative capacitance converter (e.g., NIC or NCC 202 (equivalent circuit, NIC or NCC 208)) to the input of the main buffer amplifier (e.g., main buffer amplifier 308) in the bootstrap loop, for example, as described herein regarding FIGS. 4-11. In another non-limiting aspect, applying the negative capacitance (e.g., negative equivalent capacitance 210) via the negative capacitance converter (e.g., NIC or NCC 202 (equivalent circuit, NIC or NCC 208)) can comprise applying the negative capacitance (e.g., negative equivalent capacitance 210) via the negative capacitance converter (e.g., NIC or NCC 202 (equivalent circuit, NIC or NCC 208)) between the input of the main buffer amplifier (e.g., main buffer amplifier 308) and ground 1202, for example, as described herein regarding FIGS. 12-16.

In another non-limiting example, at 1704, exemplary methods 1700 can comprise reducing source follower sensor readout interface (e.g., as described herein regarding FIGS. 4-16) noise via a bootstrap loop of the bootstrap configuration, wherein the bootstrap loop coupled to the negative capacitance (e.g., negative equivalent capacitance 210) is configured to reduce noise associated with the source follower sensor readout interface (e.g., as described herein regarding FIGS. 4-16) and that is attributable to the main buffer amplifier (e.g., main buffer amplifier 308), as further described herein.

For instance, reducing source follower sensor readout interface (e.g., as described herein regarding FIGS. 4-11) noise can comprise balancing noise associated with a negative impedance converter (NIC) buffer amplifier (e.g., NIC or NCC 202 op-amp 206) of the negative capacitance converter (e.g., NIC or NCC 202 (equivalent circuit, NIC or NCC 208)) with noise associated the main buffer amplifier (e.g., main buffer amplifier 308) to increase signal-to-noise (SNR) of the source follower sensor readout interface (e.g., as described herein regarding FIGS. 4-11).

In yet another non-limiting example, exemplary methods 1700 can further comprise reducing source follower sensor readout interface (e.g., as described herein regarding FIGS. 4-11) output impedance ($Z_{out}$) based at least in part on the applying the negative capacitance (e.g., negative equivalent capacitance 210) at the input of a main buffer amplifier (e.g., main buffer amplifier 308) in the bootstrap loop, in a further non-limiting aspect, for example, as described herein regarding FIGS. 4-11.

In addition, exemplary methods 1700 can further comprise providing, via an automatic gain control (AGC) controller component (not shown), one or more of a signal gain or signal attenuation for an output signal ($V_o$ 310) associated with the capacitive sensor (e.g., capacitive sensor 102), in still further non-limiting aspects, as described herein regarding FIGS. 15-16. For instance, in exemplary embodiments, providing the one or more of the signal gain or the signal attenuation for the output signal ($V_o$ 310) associated with the capacitive sensor (e.g., capacitive sensor 102) can comprise applying one or more of a predetermined set of capacitances (e.g., variable $C_1$ 1202) in the negative capacitance converter (e.g., NIC or NCC 202 (equivalent circuit, NIC or NCC 208)) to adjust the at least one of the signal gain or the signal attenuation, as described herein regarding FIGS. 15-16.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
    a source follower sensor readout interface comprising a
        main buffer amplifier, wherein the main buffer amplifier is configured in a bootstrap configuration at an output of a capacitive sensor; and a bootstrap loop of the bootstrap configuration comprising a negative capacitance coupled to an input of the main buffer amplifier, wherein the bootstrap configuration comprising the negative capacitance coupled to the input of the main buffer amplifier is configured to reduce noise associated with the source follower sensor readout interface and that is attributable to the main buffer amplifier.

2. The apparatus of claim 1, wherein the negative capacitance coupled to the input of the main buffer amplifier is associated with a negative capacitance converter.

3. The apparatus of claim 2, wherein the negative capacitance converter comprises a negative impedance converter (NIC) buffer amplifier configured to balance noise associated with the NIC buffer amplifier with noise associated the main buffer amplifier to increase signal-to-noise (SNR) of the source follower sensor readout interface.

4. The apparatus of claim 2, wherein the negative capacitance converter is coupled to the main buffer amplifier at the input to the main buffer amplifier.

5. The apparatus of claim 4, wherein the negative capacitance converter is coupled to the input of the main buffer amplifier in the bootstrap loop of the bootstrap configuration.

6. The apparatus of claim 4, wherein the negative capacitance converter is coupled between the input of the main buffer amplifier and ground.

7. The apparatus of claim 1, wherein the bootstrap loop of the bootstrap configuration is configured to provide a reduction of source follower sensor readout interface output impedance based at least in part on the negative capacitance.

8. The apparatus of claim 1, wherein the bootstrap loop of the bootstrap configuration is configured to provide at least one of a signal gain or signal attenuation for an output signal associated with the capacitive sensor.

9. The apparatus of claim 8, further comprising:

an automatic gain control (AGC) controller component associated with the source follower sensor readout interface configured to adjust the at least one of the signal gain or signal attenuation of the source follower sensor readout interface for the output signal associated with the capacitive sensor.

10. The apparatus of claim 9, wherein the AGC controller component is configured to apply at least one of a predetermined set of capacitances in the negative capacitance converter to adjust the at least one of the signal gain or the signal attenuation.

11. The apparatus of claim 1, wherein the bootstrap configuration comprising the negative capacitance coupled to the input of the main buffer amplifier is configured to lower output impedance associated with the source follower sensor readout interface as a result of an additional capacitance located between the negative capacitance coupled to the input of the main buffer amplifier and the source follower sensor readout interface.

12. The apparatus of claim 1, source follower sensor readout interface comprises a microelectromechanical systems (MEMS) acoustic sensor readout interface.

13. A method, comprising:

applying a negative capacitance at an input of a main buffer amplifier in a source follower sensor readout interface associated with a capacitive sensor, wherein the main buffer amplifier is configured in a bootstrap configuration at an output of the capacitive sensor;

reducing source follower sensor readout interface noise via a bootstrap loop of the bootstrap configuration, wherein the bootstrap loop of the bootstrap configuration coupled to the negative capacitance is configured to reduce noise associated with the source follower sensor readout interface and that is attributable to the main buffer amplifier.

14. The method of claim 13, wherein the applying the negative capacitance at the input of the main buffer amplifier in the source follower sensor readout interface comprises applying the negative capacitance via a negative capacitance converter coupled to the main buffer amplifier at the input to the main buffer amplifier.

15. The method of claim 14, wherein the applying the negative capacitance via the negative capacitance converter comprises applying the negative capacitance via the negative capacitance converter to the input of the main buffer amplifier in the bootstrap loop.

16. The method of claim 14, wherein the applying the negative capacitance via the negative capacitance converter comprises applying the negative capacitance via the negative capacitance converter between the input of the main buffer amplifier and ground.

17. The method of claim 14, wherein the reducing source follower sensor readout interface noise comprises balancing noise associated with a negative impedance converter (NIC) buffer amplifier of the negative capacitance converter with noise associated the main buffer amplifier to increase signal-to-noise (SNR) of the source follower sensor readout interface.

18. The method of claim 13, further comprising:

reducing source follower sensor readout interface output impedance based at least in part on the applying the negative capacitance at the input of the main buffer amplifier in the bootstrap loop.

19. The method of claim 14, further comprising:

providing, via an automatic gain control (AGC) controller component, at least one of a signal gain or signal attenuation for an output signal associated with the capacitive sensor.

20. The method of claim 19, wherein the providing the at least one of the signal gain or the signal attenuation for the output signal associated with the capacitive sensor comprises applying at least one of a predetermined set of capacitances in the negative capacitance converter to adjust the at least one of the signal gain or the signal attenuation.

* * * * *